(12) United States Patent
Kwon et al.

(10) Patent No.: US 11,794,633 B2
(45) Date of Patent: Oct. 24, 2023

(54) LIGHT-EMITTING DEVICE AND HEADLAMP FOR VEHICLE INCLUDING THE SAME

(71) Applicant: SAMSUNG ELECTRONICS CO., LTD., Suwon-si (KR)

(72) Inventors: Yongmin Kwon, Hwaseong-si (KR); Geunwoo Ko, Hwaseong-si (KR); Jaeyoon Kim, Yongin-si (KR); Jungwook Lee, Suwon-si (KR); Jonghyun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 323 days.

(21) Appl. No.: 17/177,913

(22) Filed: Feb. 17, 2021

(65) Prior Publication Data

US 2021/0362644 A1  Nov. 25, 2021

(30) Foreign Application Priority Data

May 22, 2020  (KR) .................. 10-2020-0061928

(51) Int. Cl.
*B60Q 1/14* (2006.01)
*F21S 41/153* (2018.01)
(52) U.S. Cl.
CPC .............. *B60Q 1/14* (2013.01); *F21S 41/153* (2018.01)
(58) Field of Classification Search
CPC ...... H05B 47/115; H05B 47/125; B60Q 1/14; B60Q 1/143; B60Q 1/085; F21S 41/153; F21S 41/192; F21S 41/663
See application file for complete search history.

(56) References Cited

U.S. PATENT DOCUMENTS

| 6,372,608 | B1 | 4/2002 | Shimoda et al. |
| 6,645,830 | B2 | 11/2003 | Shimoda et al. |
| RE38,466 | E | 3/2004 | Inoue et al. |
| 6,818,465 | B2 | 11/2004 | Biwa et al. |
| 6,818,530 | B2 | 11/2004 | Shimoda et al. |
| 6,858,081 | B2 | 2/2005 | Biwa et al. |
| 6,967,353 | B2 | 11/2005 | Suzuki et al. |
| 7,002,182 | B2 | 2/2006 | Okuyama et al. |
| 7,084,420 | B2 | 8/2006 | Kim et al. |

(Continued)

FOREIGN PATENT DOCUMENTS

| KR | 10-2013-0007213 A | 1/2013 |
| KR | 10-2013-0087767 A | 8/2013 |

*Primary Examiner* — Tung X Le
(74) *Attorney, Agent, or Firm* — Sughrue Mion

(57) ABSTRACT

A light-emitting device includes a plurality of first light-emitting regions contiguously arranged in a first direction. Each of the first light-emitting regions includes at least one light-emitting cell. A plurality of second light-emitting regions are contiguously arranged in the first direction. Each of the second light-emitting regions includes at least one light-emitting cell. The plurality of second light-emitting regions are adjacent to the plurality of first light-emitting regions in a second direction that intersects the first direction. A first driver controller controls emission of the plurality of first light-emitting regions. Each of the first light-emitting regions has a greater dimension than each of the second light-emitting regions in the second direction. The first driver controller simultaneously turns on or off an entirety of each of the first light-emitting regions.

20 Claims, 36 Drawing Sheets

(56) References Cited

U.S. PATENT DOCUMENTS

| | | |
|---|---|---|
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,432,511 B2 | 10/2008 | Chao et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,040,050 B2 | 10/2011 | Onushkin et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,349,912 B2 | 5/2016 | Ye et al. |
| 9,601,674 B2 | 3/2017 | Yeh et al. |
| 9,879,835 B2 * | 1/2018 | Taudt .................... F21S 41/265 |
| 10,418,524 B2 | 9/2019 | Jing et al. |
| 10,632,898 B2 * | 4/2020 | Chingyo ............... B60Q 1/0011 |
| 11,629,833 B1 * | 4/2023 | Wu ........................ F21S 41/143 |
| | | 362/511 |
| 2007/0147055 A1 * | 6/2007 | Komatsu ................ B60Q 1/085 |
| | | 362/464 |
| 2016/0144771 A1 * | 5/2016 | Miyachi ................ B60Q 1/143 |
| | | 362/465 |
| 2016/0372515 A1 * | 12/2016 | Miyoshi ............... H01L 25/0753 |
| 2018/0245760 A1 * | 8/2018 | Kanayama .............. F21S 41/29 |
| 2019/0051233 A1 | 2/2019 | Kweon et al. |
| 2019/0219241 A1 * | 7/2019 | Renaud ................. F21S 41/143 |
| 2019/0264884 A1 * | 8/2019 | Gromfeld ............... F21S 41/25 |
| 2019/0326349 A1 | 10/2019 | Kwon et al. |
| 2020/0025351 A1 | 1/2020 | Kwon et al. |
| 2021/0278058 A1 * | 9/2021 | Muegge ................ F21S 41/153 |

\* cited by examiner

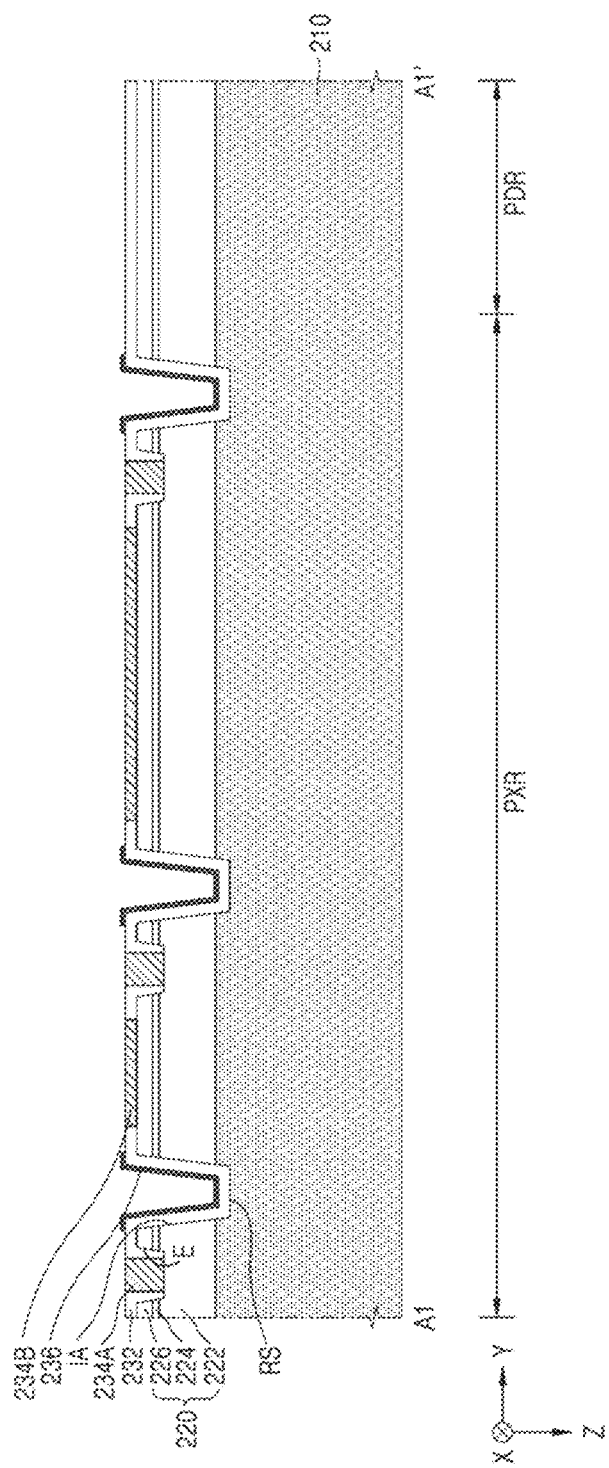

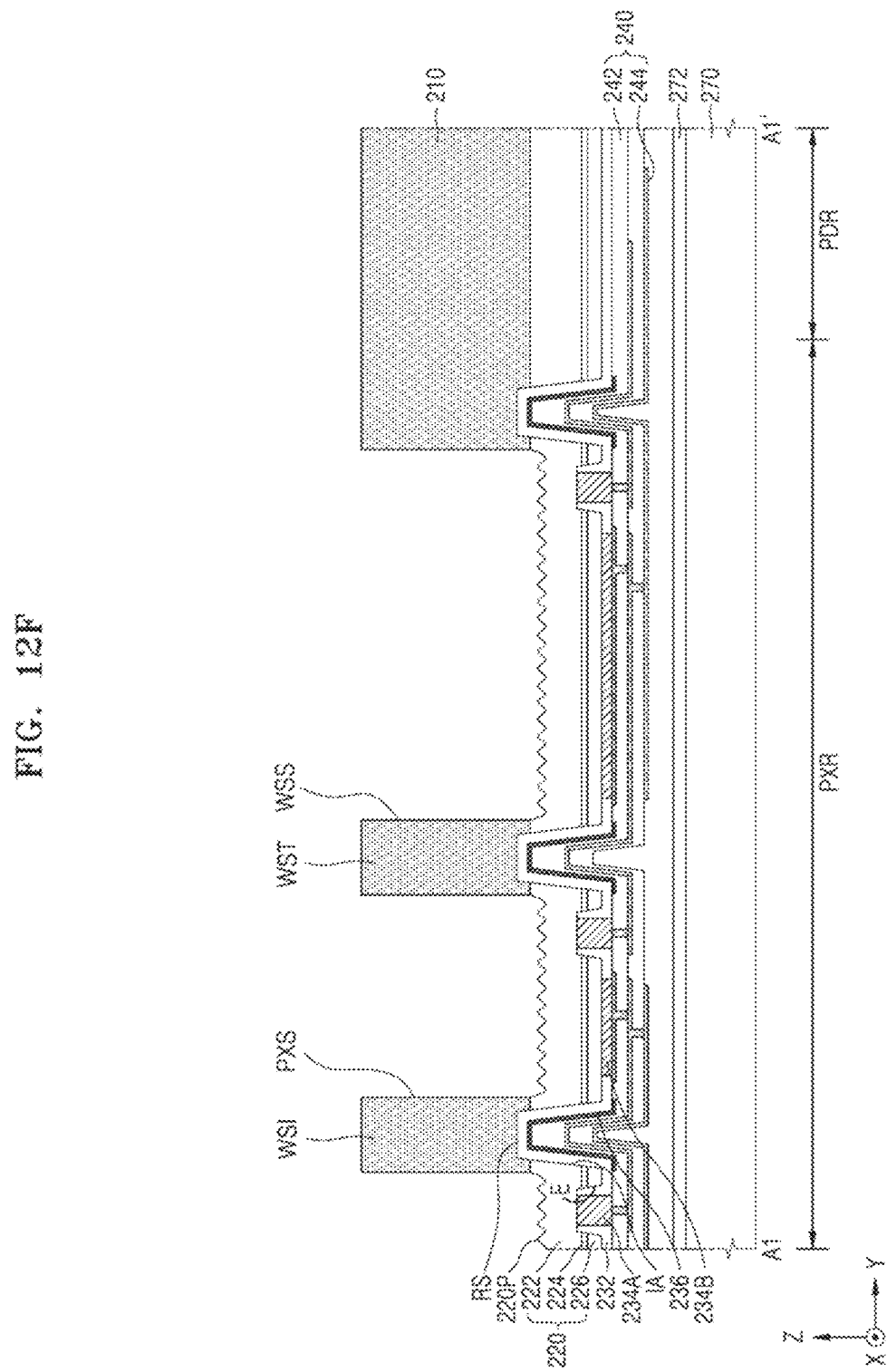

LIGHT-EMITTING DEVICE AND HEADLAMP FOR VEHICLE INCLUDING THE SAME

CROSS-REFERENCE TO RELATED APPLICATION

This application claims the benefit of Korean Patent Application No. 10-2020-0061928, filed on May 22, 2020, in the Korean Intellectual Property Office, the disclosure of which is incorporated by reference herein in its entirety.

BACKGROUND

The disclosure relates to a light-emitting device and a headlamp for a vehicle, and more particularly, to a light-emitting device and a headlamp for a vehicle that may reduce the burden of controlling operation of each light-emitting region and that may be manufactured in a simple, inexpensive manner.

Light-emitting devices are used as light sources for various electronic products. In recent years, semiconductor light-emitting devices have widely been applied to transportation devices, such as vehicles. There is still room for optimization in terms of operation and cost by harmonizing characteristics of the transportation devices with characteristics of the semiconductor light-emitting devices, and research on this is ongoing.

SUMMARY

One or more example embodiments provide a light-emitting device that may have a low burden of operation control of each light-emitting region and that may be manufactured in a simple, inexpensive manner.

Also, one or more example embodiments provide a headlamp for a vehicle that may have a low burden of operation control of each light-emitting region and may be manufactured in a simple, inexpensive manner.

In accordance with an aspect of an example embodiment, a light-emitting device includes: a plurality of first light-emitting regions contiguously arranged in a first direction, wherein each first light-emitting region includes at least one light-emitting cell; a plurality of second light-emitting regions contiguously arranged in the first direction, wherein each second light-emitting region includes at least one light-emitting cell, and the plurality of second light-emitting regions are adjacent to the plurality of first light-emitting regions in a second direction that intersects the first direction; and a first driver controller configured to control emission of the plurality of first light-emitting regions, wherein each first light-emitting region of the plurality of first light-emitting regions has a dimension greater than a dimension of each second light-emitting region of the plurality of second light-emitting regions in the second direction, and wherein the first driver controller is further configured to simultaneously turn on or off an entirety of each first light-emitting region of the first light-emitting regions.

In accordance with an aspect of an example embodiment, a headlamp for a vehicle includes a light-emitting device including: a plurality of first light-emitting regions contiguously arranged in a first direction, wherein each first light-emitting region of the plurality of first light-emitting regions includes at least one light-emitting cell, and each first light-emitting region of the plurality of first light-emitting regions has a dimension of A in the first direction and has a dimension of B in a second direction that intersects the first direction and is greater than A; a plurality of second light-emitting regions contiguously arranged in the first direction, wherein each second light-emitting region of the plurality of second light-emitting regions includes at least one light-emitting cell, and the plurality of second light-emitting regions are adjacent to the plurality of first light-emitting regions in the second direction; and a first driver controller configured to control emission of the plurality of first light-emitting regions, wherein the first direction is a horizontal direction, wherein the first driver controller is further configured to independently control on and off operations of each first light-emitting region of the plurality of first light-emitting regions, and wherein the first driver controller is further configured to turn on or off an entirety of each first light-emitting region of the plurality of first light-emitting regions.

In accordance with an aspect of an example embodiment, a headlamp for a vehicle includes a light-emitting device including: a plurality of first light-emitting regions contiguously arranged in a first direction, wherein each first light-emitting region of the plurality of first light-emitting regions includes at least one light-emitting cell; a plurality of second light-emitting regions contiguously arranged in the first direction, wherein each first light-emitting region of the plurality of second light-emitting regions includes at least one light-emitting cell and the plurality of second light-emitting regions are adjacent to the plurality of first light-emitting regions in a second direction that intersects the first direction; and a first driver controller configured to control emission of the plurality of first light-emitting regions, wherein the first direction is a horizontal direction, and each first light-emitting region of the plurality of first light-emitting regions has a dimension of A in the first direction and a dimension of B in the second direction, and a ratio of A to B is about 1:1.5 to about 1:4.5.

BRIEF DESCRIPTION OF THE DRAWINGS

The above and other aspects of certain example embodiments will be more apparent from the following description taken in conjunction with the accompanying drawings in which:

FIGS. 12A to 12M are cross-sectional views of a process sequence of a method of manufacturing a light-emitting device, according to an example embodiment;

DETAILED DESCRIPTION

Figure 1:
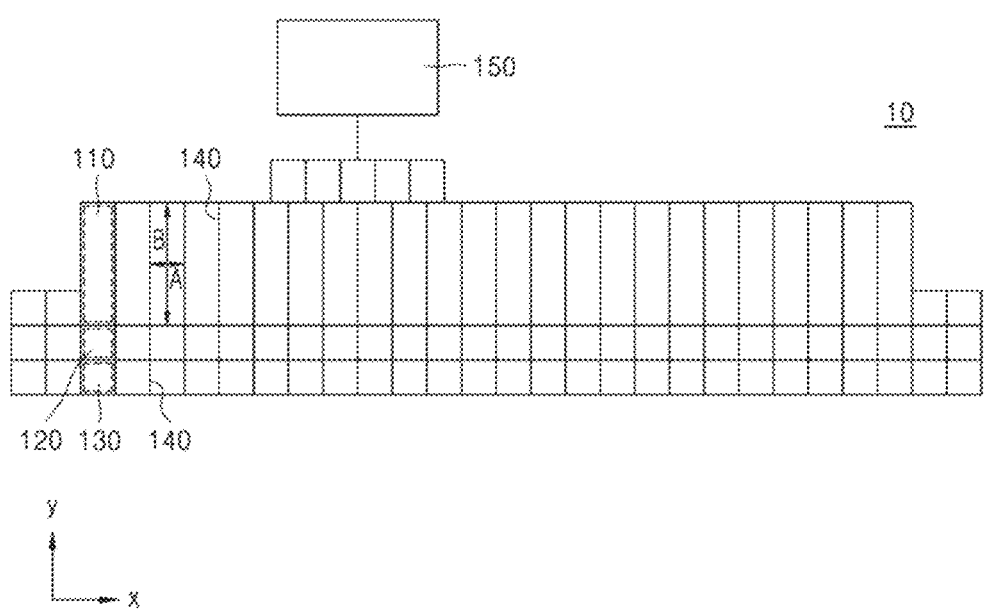
FIG. 1 is a schematic diagram of a light-emitting device according to an example embodiment.

Hereinafter, example embodiments will be described in detail with reference to the accompanying drawings. The same reference numerals are used to denote the same elements in the drawings, and repeated descriptions thereof will be omitted.

FIG. 1 is a schematic diagram of a light-emitting device 10 according to an example embodiment.

Referring to FIG. 1, the light-emitting device 10 may include a plurality of first light-emitting regions 110. The plurality of first light-emitting regions 110 may be arranged adjacent to each other in a first direction (e.g., the x direction of FIG. 1). In other words, the plurality of first light-emitting regions 110 may be contiguously arranged in the x direction. In some embodiments, each of the plurality of first light-emitting regions 110 may have substantially the same size and shape.

Each of the plurality of first light-emitting regions 110 may be defined by a partition wall 140 and include at least one light-emitting cell. As shown in FIG. 1, the partition wall 140 may surround an outer edge of the first light-emitting region 110 and protrude more than a light-emitting element of the first light-emitting region 110. In other words, the partition wall 140 may have a larger perimeter than that of the light-emitting element that it surrounds. In some embodiments, a fluorescent layer including a fluorescent material may be further provided on an area defined by the partition wall 140.

In addition, the light-emitting device 10 may include a plurality of second light-emitting regions 120. The plurality of second light-emitting regions 120 may be arranged adjacent to each other in the first direction (e.g., x direction). In some embodiments, the plurality of second light-emitting regions 120 may each have substantially the same size and shape.

Each of the plurality of second light-emitting regions 120 may be defined by the partition wall 140 and include at least one light-emitting cell. As shown in FIG. 1, the partition wall 140 may surround an outer edge of the second light-emitting region 120 and protrude more than a light-emitting element of the second light-emitting region 120. In other words, the partition wall 140 may have a larger perimeter than that of the light-emitting element that it surrounds. In some embodiments, a fluorescent layer including a fluorescent material may be further provided on an area defined by the partition wall 140.

The plurality of second light-emitting regions 120 may be adjacent to the plurality of first light-emitting regions 110 in a second direction (e.g., they direction of FIG. 1). The first direction and the second direction may intersect each other but are not necessarily orthogonal to each other. In some embodiments, the first direction may be orthogonal to the second direction.

In some embodiments, a dimension of the first light-emitting region 110 in the first direction may be substantially equal to a dimension of the second light-emitting region 120 in the first direction. In some embodiments, a side surface of the first light-emitting region 110, which extends in the second direction, may be aligned with a side surface of the second light-emitting region 120, which extends in the second direction.

A dimension of the first light-emitting region 110 in the second direction may be greater than a dimension of the second light-emitting region 110 in the second direction. In some embodiments, the dimension of the first light-emitting region 110 in the second direction may be about 1.5 to 4.5 times the dimension of the second light-emitting region 110 in the second direction.

As shown in FIG. 1, the first light-emitting region 110 may have a dimension of A in the first direction and a dimension of B in the second direction. In this case, a ratio of A to B may range from about 1:1.5 to about 1:4.5. Here, the dimension (i.e., A) of the first light-emitting region 110 in the first direction may refer to a distance between two partition walls positioned opposite to each other in the first direction in the first light-emitting region 110, and the dimension (i.e., B) of the first light-emitting region 110 in the second direction may refer to a distance between two partition walls positioned opposite to each other in the second direction in the first light-emitting region 110.

In some embodiments, the ratio of A to B may be about 1:1.3 to about 1:8, about 1:1.4 to about 1:6, about 1:1.5 to about 1:4.5, about 1:1.8 to about 1:4, or about 1:2 to about 1:3.5 and may include any range therebetween.

Figure 2A:
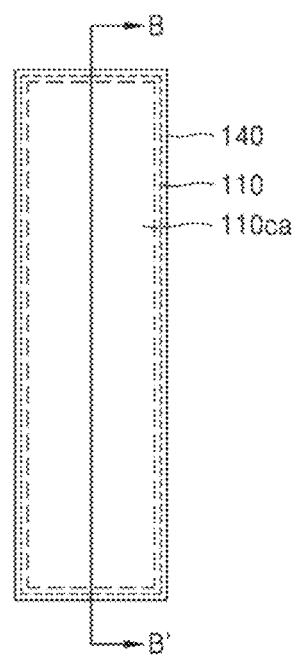
FIG. 2A is a partial enlarged view illustrating a case in which a first light-emitting region includes one light-emitting cell.

The first light-emitting region 110 may include at least one light-emitting cell. FIG. 2A is a partial enlarged view illustrating a case in which the first light-emitting region 110 includes one light-emitting cell, and FIG. 2B is a cross-sectional view of the first light-emitting region 110 of FIG. 2A, which is taken along a line B-B' of FIG. 2A.

Figure 2B:
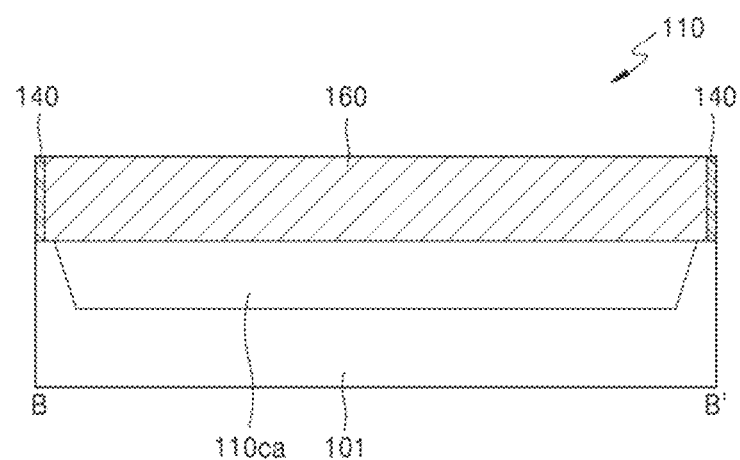
FIG. 2B is a cross-sectional view of the first light-emitting region of FIG. 2A, taken along line B-B' of FIG. 2A.

Referring to FIGS. 2A and 2B, one first light-emitting region 110 may be surrounded and defined by a partition wall 140, and one light-emitting cell 110*ca* may be positioned in the first light-emitting region 110. The light-emitting cell 110*ca* may include one first conductive semiconductor layer, one active layer, and one second conductive semiconductor layer, which are positioned in a substrate 101. The second conductive semiconductor layer may have a different conductivity type from the first conductive semiconductor layer. A detailed configuration of the light-emitting cell 110ca will be described in further detail below.

A fluorescent layer 160 may be provided on the light-emitting cell 110ca in the first light-emitting region 110. The fluorescent layer 160 may include a fluorescent material. The partition wall 140 may protrude over a top surface of the light-emitting cell 110ca as described above, and a top surface of the partition wall 140 may be substantially coplanar with a top surface of the fluorescent layer 160 as shown in FIG. 2B.

Figure 3A:
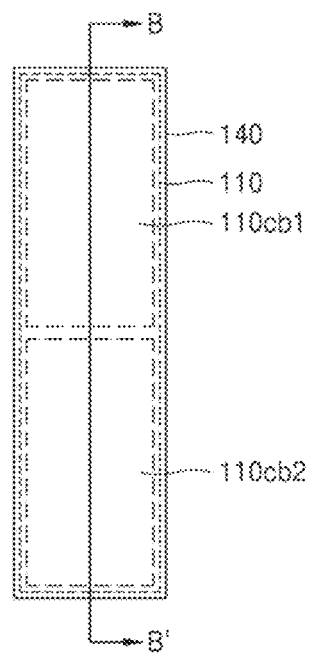
FIG. 3A is a partial enlarged view illustrating a case in which a first light-emitting region includes two light-emitting cells.
Figure 3B:
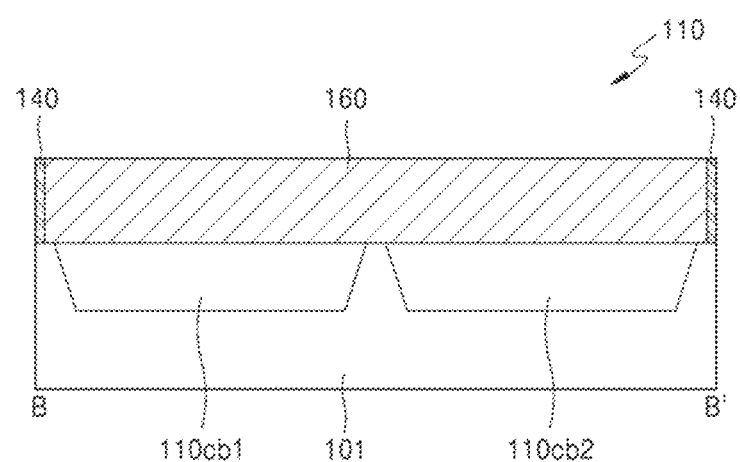
FIG. 3B is a cross-sectional view of the first light-emitting region of FIG. 3A, taken along line B-B' of FIG. 3A.

FIG. 3A is a partial enlarged view illustrating a case in which the first light-emitting region 110 includes two light-emitting cells, and FIG. 3B is a cross-sectional view of the first light-emitting region 110, taken along a line B-B' of FIG. 3A.

Referring to FIGS. 3A and 3B, one first light-emitting region 110 may be surrounded and delimited by a partition wall 140, and two light-emitting cells (e.g., first and second light-emitting cells 110cb1 and 110cb2) may be positioned in the first light-emitting region 110. A partition wall may not be located between the first and second light-emitting cells 110cb1 and 110cb2 positioned in one first light-emitting region 110. In other words, the partition wall 140 may be located entirely outside of a perimeter of the first light-emitting region 110.

Each of the first and second light-emitting cells 110cb1 and 110cb2 may include one first conductive semiconductor layer, one active layer, and one second conductive semiconductor layer, which are positioned in a substrate 101. The second conductive semiconductor layer may have a different conductivity type from the first conductive semiconductor layer. Specific configurations of the first and second light-emitting cells 110cb1 and 110cb2 will be described in further detail below.

Although FIGS. 3A and 3B illustrate an example in which two light-emitting cells (e.g., 110cb1 and 110cb2) are provided in one first light-emitting region 110, it will be understood by one skilled in the art that at least three light-emitting cells may be provided in one first light-emitting region 110. For example, 2 to 20 light-emitting cells, 2 to 15 light-emitting cells, 2 to 10 light-emitting cells, 2 to 7 light-emitting cells, or 2 to 5 light-emitting cells may be provided in one first light-emitting region 110.

Referring back to FIG. 1, the light-emitting device 10 may include a plurality of third light-emitting regions 130. The plurality of third light-emitting regions 130 may be arranged adjacent to each other (i.e., contiguously) in a first direction (e.g., the x direction of FIG. 1). In some embodiments, the plurality of third light-emitting regions 130 may each have the same size and shape.

Each of the plurality of third light-emitting regions 130 may be defined by the partition wall 140 and include at least one light-emitting cell. As shown in FIG. 1, the partition wall 140 may surround an outer edge of the third light-emitting region 130 and protrude more than a light-emitting element of the third light-emitting region 130. In other words, the partition wall 140 may have a larger perimeter than that of the light-emitting element that it surrounds. In some embodiments, a fluorescent layer including a fluorescent material may be further provided on an area defined by the partition wall 140.

The plurality of third light-emitting regions 130 may be positioned adjacent to the plurality of second light-emitting regions 120 in a second direction (e.g., a y direction). In addition, the plurality of third light-emitting regions 130 may be spaced apart from the plurality of first light-emitting regions 110 with the plurality of second light-emitting regions 120 therebetween.

In some embodiments, the third light-emitting region 130 may have substantially the same size and shape as the second light-emitting region 120. In some embodiments, a dimension of the third light-emitting region 130 in the first direction may be substantially equal to a dimension of the second light-emitting region 120 in the first direction. In some embodiments, a dimension of the third light-emitting region 130 in the second direction may be substantially equal to a dimension of the second light-emitting region 120 in the second direction.

In some embodiments, a dimension of the first light-emitting region 110 in the first direction may be substantially equal to a dimension of the third light-emitting region 130 in the first direction. In some embodiments, a side surface of the first light-emitting region 110, which extends in the second direction, may be aligned with a side surface of the third light-emitting region 130, which extends in the second direction.

The light-emitting device 10 may further include a first driver controller 150 configured to control operations of the plurality of first light-emitting regions 110 as shown in FIG. 1. The first driver controller 150 may control on-off operations of the plurality of first light-emitting regions 110.

In some embodiments, the first driver controller 150 may be configured to control operations of some of the plurality of first light-emitting regions 110. In this case, an additional first driver controller 150 capable of controlling operations of the remaining first light-emitting regions 110 may be further provided. In some embodiments, the first driver controller 150 may be configured to control operations of at least one first light-emitting region 110 and/or at least one second light-emitting region 120.

When one first light-emitting region 110 is turned on via the control of the first driver controller 150, the light emission of the first light-emitting region 110 may be simultaneously started over the total area (i.e., an entirety) of the one first light-emitting region 110. That is, when one first light-emitting region 110 is turned on via the control of the first driver controller 150, the light-emitting device 10 may be configured such that all of at least one light-emitting cell of the one first light-emitting region 110 is substantially simultaneously turned on.

In addition, when one first light-emitting region 110 is turned off via the control of the first driver controller 150, the light emission of the first light-emitting region 110 may be simultaneously stopped over the total area of the one first light-emitting region 110. That is, when one first light-emitting region 110 is turned off via the control of the first driver controller 150, the light-emitting device 10 may be configured such that all of at least one light-emitting cell of the one first light-emitting region 110 is substantially simultaneously turned off.

Figure 4:
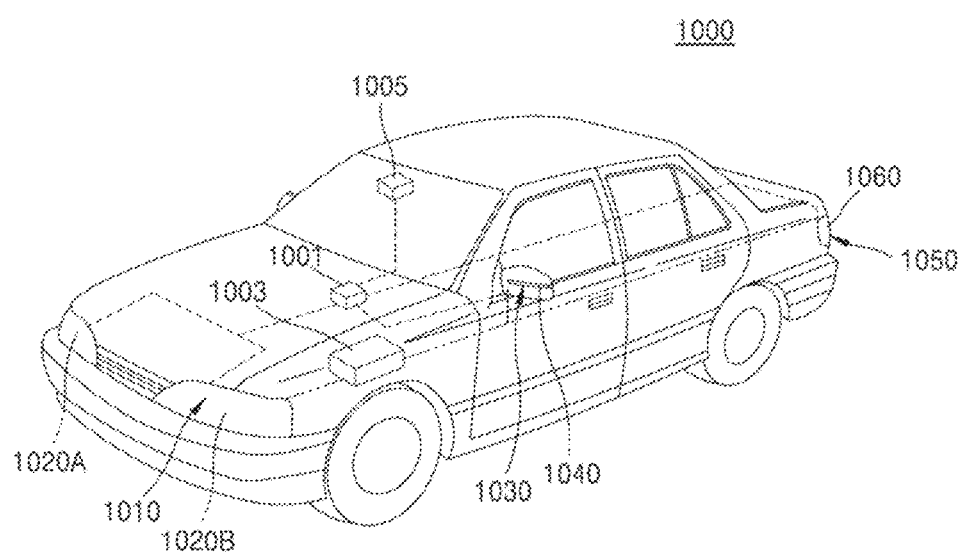
FIG. 4 is a perspective view of a vehicle according to an example embodiment.

FIG. 4 is a perspective view of a vehicle 1000 according to an example embodiment.

Although FIG. 4 illustrates an automobile as the vehicle 1000, the vehicle 1000 is not limited thereto. The vehicle 1000 may be a land vehicle such as a bicycle, a tricycle, a passenger car, a caterpillar tractor, a train, or a tram; a marine vehicle such as a ship, a boat, and a submarine; and an air vehicle such as a plane and a helicopter, but is not limited thereto.

Referring to FIG. 4, headlamp modules 1020A and 1020B may be installed in a headlamp unit 1010 of the vehicle 1000. A side mirror lamp module 1040 may be installed in an outer side mirror unit 1030, and a tail lamp module 1060 may be installed in a tail lamp unit 1050. The headlamp modules 1020A and 1020B may be light source modules including the light-emitting device 10 described above.

A power supply device 1003 embedded in the vehicle 1000 may supply power to each of the headlamp modules 1020A and 1020B, the side mirror lamp module 1040, and the tail lamp module 1060. Also, a controller 1001 embedded in the vehicle 1000 may be configured to control operations including on/off operations of the headlamp modules 1020A and 1020B, the side mirror lamp module 1040, and the tail lamp module 1060.

The controller 1001 may be a first driver controller (refer to 150 in FIG. 1) described above. As another example, the controller 1001 may be electrically connected to the first driver controller 150 and configured to control the first driver controller 150.

The vehicle 1000 may further include a vision recognition device 1005. The vision recognition device 1005 may detect an object in front of the vehicle 1000 and movements of the object. The vision recognition device 1005 may include a camera, a processor, and an output device. The camera may receive a front view in front of the camera and/or the vehicle 1000 and convert the front view into digital data. The processor may identify a position to which light emitted by the headlamp modules 1020A and 1020B is to be irradiated and a position to which the light is not to be irradiated, by using the digital data. The output device may transmit a processing result of the processor to the controller 1001.

Figure 5:
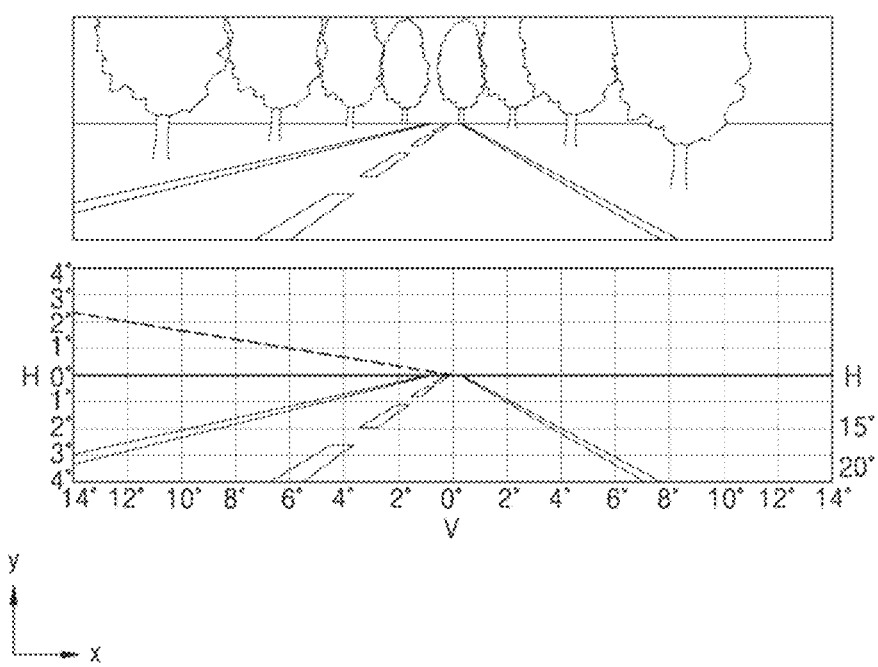
FIG. 5 is a schematic diagram showing a landscape recognized by a vision recognition device of a vehicle.

FIG. 5 is a schematic diagram showing a landscape recognized by the vision recognition device 1005 of FIG. 4. An upper diagram of FIG. 5 shows a recognized real landscape, and a lower diagram thereof shows results obtained by extracting main recognition objects from the recognized real landscape.

Referring to FIG. 5, the vehicle 1000 may be located on a road, and the vision recognition device 1005 of the vehicle 1000 may recognize objects within a range of about −4 degrees)(°) to about +4° in a vertical direction by using the horizon H as a reference point of the vertical direction. Also, the vision recognition device 1005 may recognize objects within a range of about −14° to about +14° in a lateral direction (e.g., a horizontal direction) by using a front direction V as a reference point of the lateral direction. However, it will be understood by one skilled in the art that a recognition range in the vertical direction and/or the lateral direction may be increased or reduced as needed.

The vision recognition device 1005 may identify each of stationary objects and moving objects in the above-described ranges of viewing angle.

Figure 6:
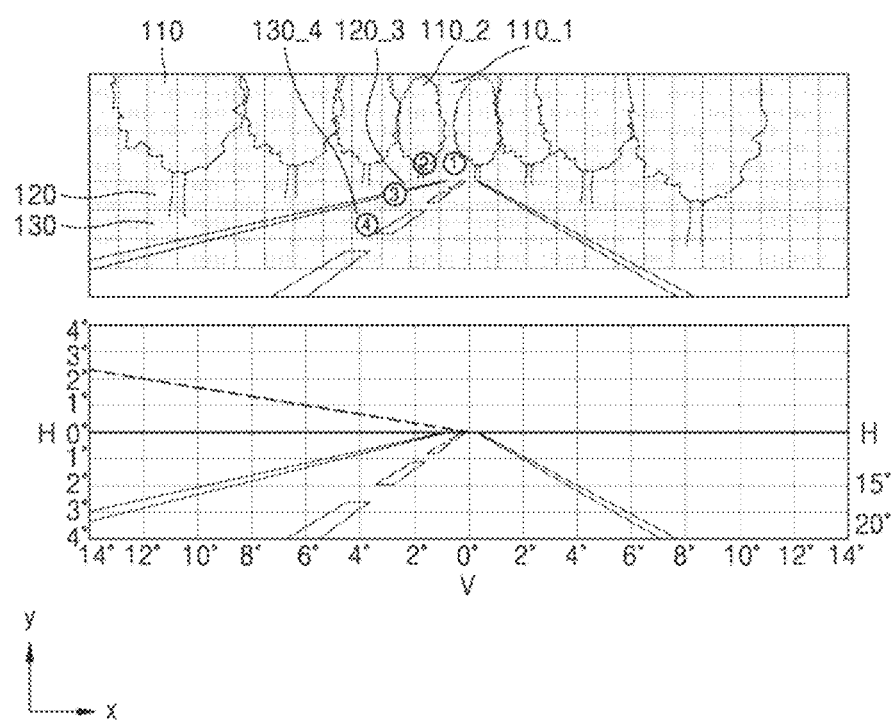
FIG. 6 is a conceptual diagram showing a range of light emitted by a headlamp module in a recognized landscape.

FIG. 6 is a conceptual diagram showing a range of light emitted by the headlamp modules 1020A and 1020B of FIG. 4 in the landscape recognized by the vision recognition device 1005 of FIG. 4.

Referring to FIG. 6, light emitted by the headlamp modules 1020A and 1020B may illuminate an area within a range of about −1° to about +4° in a vertical direction and may illuminate an area within a range of about −14° to about +14° in a lateral direction (i.e., horizontal direction when the headlamp modules 1020A and 1020B are mounted on the vehicle 1000). Here, the lateral direction may be the first direction (i.e., the x direction) in FIG. 1 and the description thereof, and the vertical direction may be the second direction (i.e., y direction) in FIG. 1 and the description thereof.

Accordingly, the headlamp modules 1020A and 1020B may cause light to be radiated from portions corresponding to a plurality of first light-emitting regions (refer to 110 in FIG. 1), a plurality of second light-emitting regions (refer to 120 in FIG. 1), and a plurality of third light-emitting regions (refer to 130 in FIG. 1), which are sequentially arranged from top to bottom. FIG. 6 shows the locations in the illuminated area corresponding to each of the plurality of first, second, and third light-emitting regions 110, 120, and 130.

Each of the first, second, and third light-emitting regions 110, 120, and 130 may be controlled to be turned on or off as needed. On/off control operations of each of the first, second, and third light-emitting regions 110, 120, and 130 may be controlled by a first driver controller (refer to 150 in FIG. 1). In particular, the first light-emitting region 110 is positioned at a higher location relative to the second and the third light-emitting regions 120 and 130 and configured to irradiate light a relatively farther distance. As such, when another vehicle approaches the vehicle 1000 of FIG. 4 in the front, the light emitted from the first light-emitting region 110 may disturb the driving of the other vehicle. Therefore, on/off operations of some light-emitting regions may be dynamically controlled in response to a position of the other vehicle so as not to disturb the driving of the other vehicle that approaches in the front.

Specifically, when another vehicle approaches the vehicle 1000 at a position ①, the first driver controller 150 may turn off the first light-emitting region 110_1 corresponding to the position ①. Thereafter, when the other vehicle gradually approaches, the other vehicle may be at a position ②. In this case, the first driver controller 150 may turn off the first light-emitting region 110_2 corresponding to a position ② and turn on the first light-emitting region 110_1 corresponding to the position ① that was previously turned off.

In some embodiments, when it is determined that the other vehicle is between the positions ① and ②, the first driver controller 150 may simultaneously turn off the first light-emitting regions 110_1 and 110_2.

Subsequently, when the other vehicle further approaches and reaches a position ③, the first driver controller 150 may turn off a second light-emitting region 120_3 corresponding to the position ③ and turn on the first light-emitting region 110_2 corresponding to the position ② that was previously turned off. Furthermore, when the other vehicle further approaches and reaches a position ④, the first driver controller 150 may turn off a third light-emitting region 130_4 corresponding to the position ④ and turn back on the second light-emitting region 120_3 corresponding to the position ③ that was previously turned off.

As described above, by recognizing a position of another vehicle, which approaches the vehicle 1000, and turning off a light-emitting region corresponding to the position of the other vehicle, driving safety may be improved by facilitating the driving of the other vehicle. Although a case in which only one vehicle approaches the vehicle 1000 has been described above, it will be understood by one skilled in the art that the first driver controller 150 may operate in the same manner as described above even when at least two vehicles approach the vehicle 1000.

Moreover, as shown in FIG. 6, as more light-emitting regions are divided in the lateral direction, it may be possible to control more finely an irradiation area irradiated with light and a non-irradiation area that is not irradiated with light. In addition, as the second light-emitting region 120 and light-emitting regions (e.g., the third light-emitting region 130) positioned thereunder are sub-divided in the vertical direction, it may be possible to finely control the irradiation area and the non-irradiation area because a position of a light-emitting region corresponding to an approaching vehicle in the vertical direction changes according to a position of the approaching vehicle.

By comparison, because the first light-emitting region 110 illuminates the vicinity of the horizon and midair above the horizon, the first light-emitting regions 110 may have a low need to be subdivided when another vehicle approaches. Therefore, the emission of light in the lateral direction may be finely controlled by reducing a dimension of the first light-emitting region 110 in the lateral direction, while the burden of control in the vertical direction may be reduced by increasing a dimension of the first light-emitting region 110 in the vertical direction.

Furthermore, when a single light-emitting cell is formed in the first light-emitting region 110, the number of light-emitting cells may be reduced, and thus, manufacturing costs may be reduced.

Figure 7:
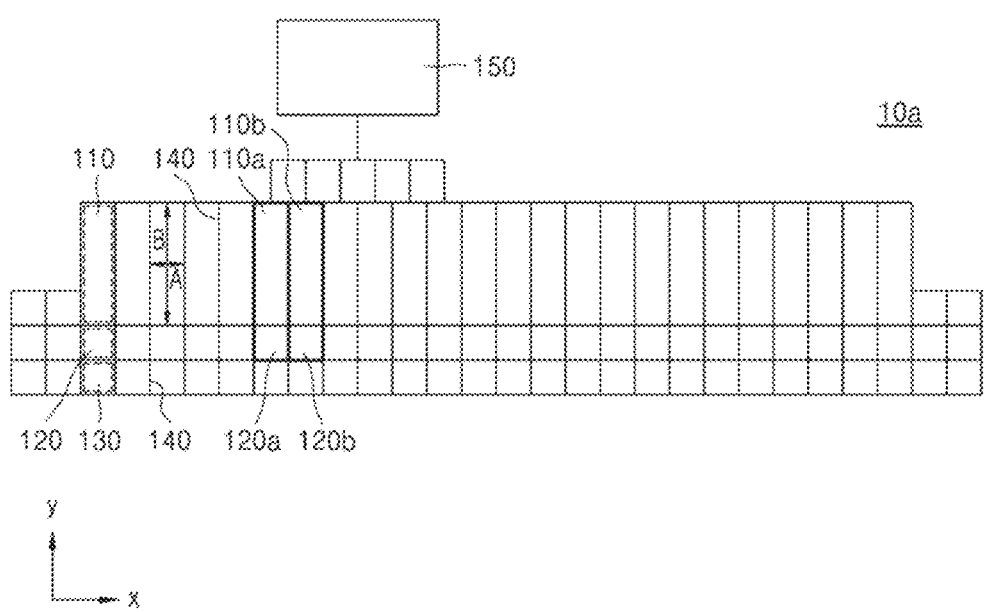
FIG. 7 is a schematic diagram of a light-emitting device according to an example embodiment.

FIG. 7 is a schematic diagram of a light-emitting device 10a according to an example embodiment.

The light-emitting device 10a shown in FIG. 7 may be substantially the same as the light-emitting device 10 shown in FIG. 1 except that at least some of the plurality of first light-emitting regions 110 and at least some of the plurality of second light-emitting regions 120 are provided in pairs and a first driver controller 150 is configured to simultaneously turn on or off a pair of the first light-emitting region 110 and the second light-emitting region 120. In other words, a first light-emitting region 110 may be paired with a second light-emitting region 120. Accordingly, differences between the light-emitting device 10a shown in FIG. 7 and the light-emitting device 10 shown in FIG. 1 will mainly be described below.

Referring to FIG. 7, the first light-emitting region 110a and the second light-emitting region 120a, which are adjacent to each other in a second direction (e.g., a y direction), may be provided in a pair and configured to be always simultaneously turned on or off. Also, another first light-emitting region 110b and another second light-emitting region 120b, which are adjacent to each other in the second direction (e.g., the y direction), may be provided as a pair and configured to be always simultaneously turned on or off. Not all of the first light-emitting regions 110 and the second light-emitting regions 120 may be provided in pairs. Some of the first light-emitting regions 110 and some of the second light-emitting regions 120 may be provided in pairs.

Figure 8:
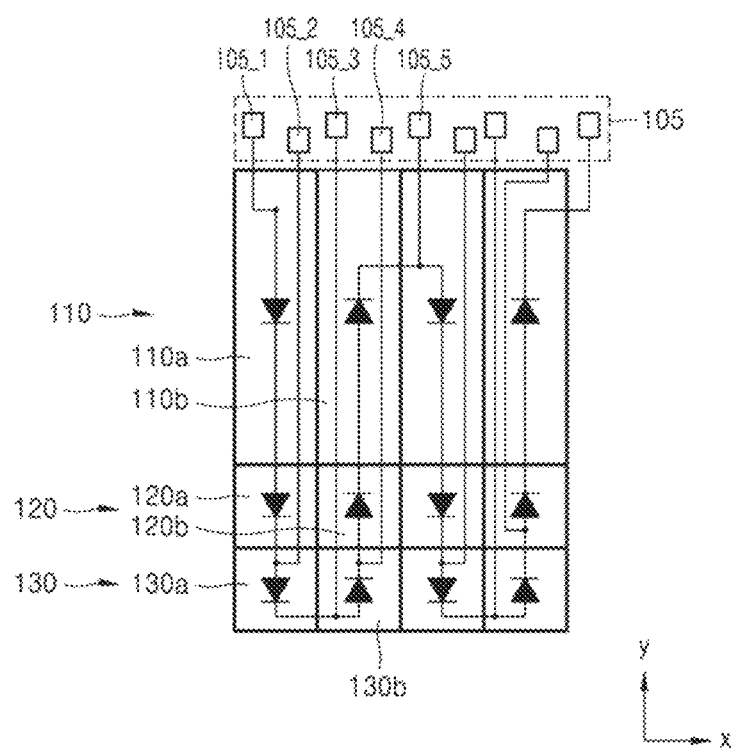
FIG. 8 is a schematic circuit diagram of the light-emitting device of FIG. 7, in which a first light-emitting region and a second light-emitting region are provided as a pair and simultaneously turned on or off.

FIG. 8 is a schematic circuit diagram of the light-emitting device 10a of FIG. 7, in which the first light-emitting region 110 and the second light-emitting region 120 are provided as a pair and simultaneously turned on or off.

Referring to FIG. 8, each of a plurality of first light-emitting regions 110, a plurality of second light-emitting regions 120, and a plurality of third light-emitting regions 130 may be arranged in a first direction (e.g., the x direction of FIG. 8). The plurality of second light-emitting regions 120 may be positioned adjacent to the plurality of first light-emitting regions 110 in a second direction (e.g., the y direction of FIG. 8), and the plurality of third light-emitting regions 130 may be positioned adjacent to the plurality of second light-emitting regions 120 in the second direction (e.g., they direction).

Although FIG. 8 illustrates a case in which each of the first light-emitting regions 110a and 110b included in the plurality of first light-emitting regions 110 has one light-emitting cell, it will be understood by one skilled in the art that each of the first light-emitting regions 110a and 110b may have at least two light-emitting cells.

Respective light-emitting cells included in the plurality of first light-emitting regions 110, the plurality of second light-emitting regions 120, and the plurality of third light-emitting regions 130 may be electrically connected to each other by electrically connecting a cathode of any one light-emitting cell to an anode of a light-emitting cell positioned adjacent thereto.

The first driver controller 150 of FIG. 7 may individually turn on or off each of the first, second, and third light-emitting regions 110, 120, and 130. In some embodiments, the first driver controller 150 may adjust brightness of each of the first, second, and third light-emitting regions 110, 120, and 130 using a pulse width modulation (PWM) scheme.

The first, second, and third light-emitting regions 110, 120, and 130 may be connected in series to each other. Operations of each of the first, second, and third light-emitting regions 110, 120, and 130 may be controlled by controlling a voltage applied to each of pads 105. The first light-emitting region 110a located at a left upper portion of FIG. 8 and the second light-emitting region 120a illustrated under the first light-emitting region 110a may be simultaneously turned on or off by controlling voltages applied to a first pad 105_1 and a second pad 105_2 provided at either end thereof.

In addition, the third light-emitting region 130a illustrated under the second light-emitting region 120a may be turned on or off by controlling voltages applied to the second pad 105_2 and a third pad 105_3 provided at either end of the third light-emitting region 130a. The third light-emitting region 130b positioned adjacent to the third light-emitting region 130a may be turned on or off by controlling voltages applied to the third pad 105_3 and a fourth pad 105_4 provided at either end of the third light-emitting region 130b.

The first light-emitting region 110b, which is on a second-left upper portion of FIG. 8 and the second light-emitting region 120b illustrated under the first light-emitting region 110b may be simultaneously turned on or off by controlling voltages applied to the fourth pad 105_4 and a fifth pad 105_5 provided at either end thereof.

Although an example of the light-emitting device 10a of FIG. 7 in which the first light-emitting region 110 and the second light-emitting region 120 are simultaneously turned on or off as a pair, one skilled in the art may apply other examples.

Figure 9:
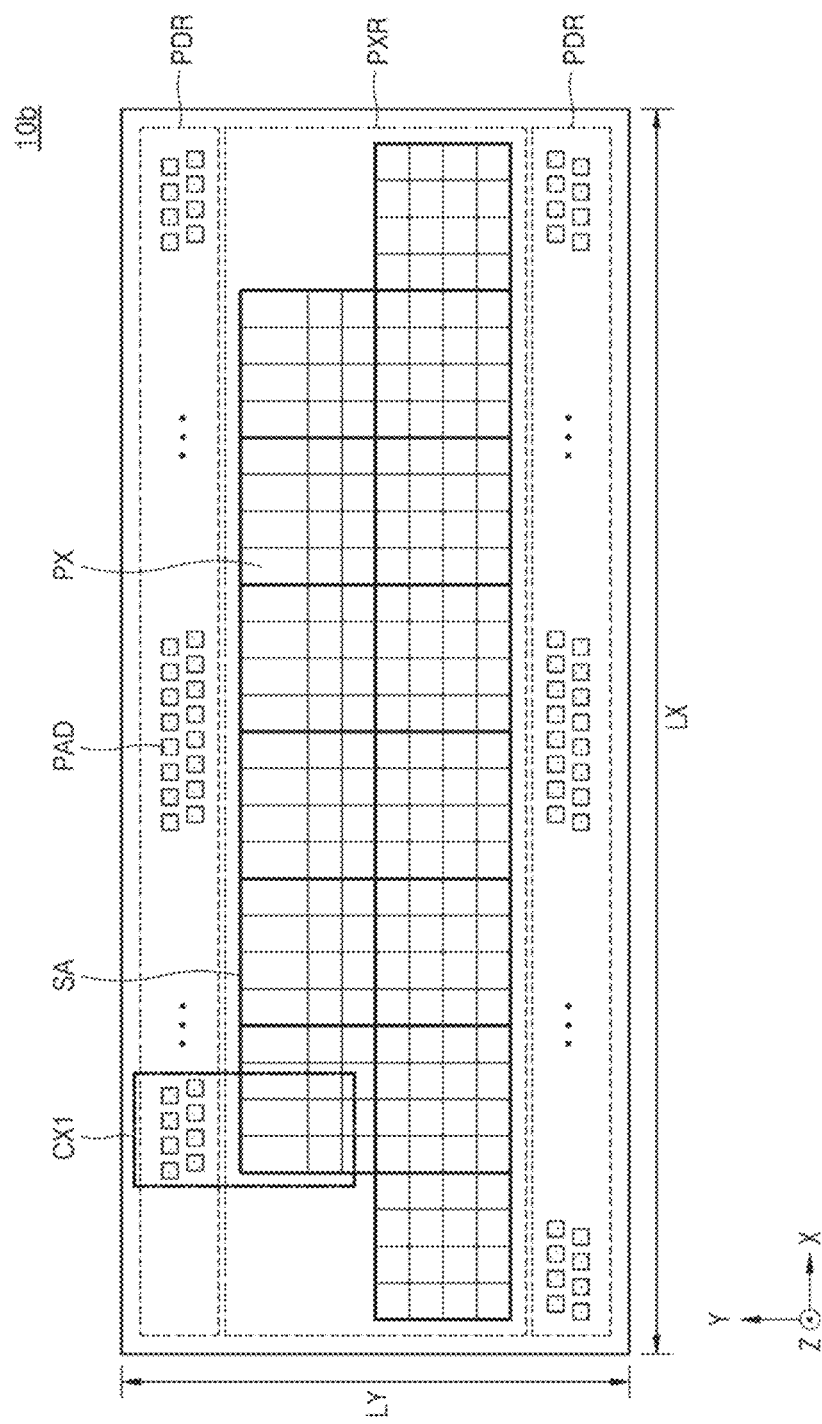
FIG. 9 is a plan view of a light-emitting device according to an example embodiment.
Figure 10:
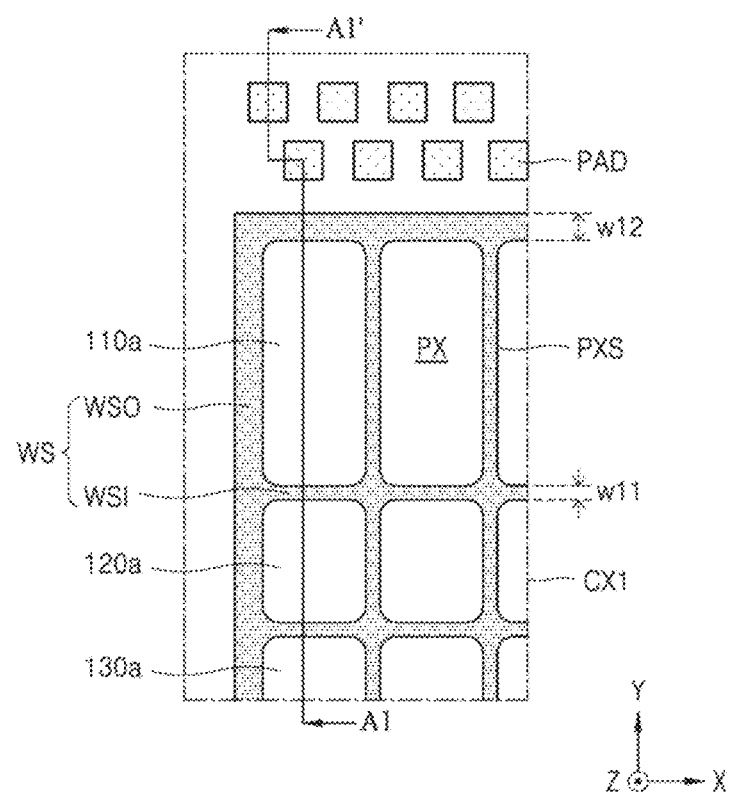
FIG. 10 is an enlarged view of portion CX1 of FIG. 9.
Figure 11:
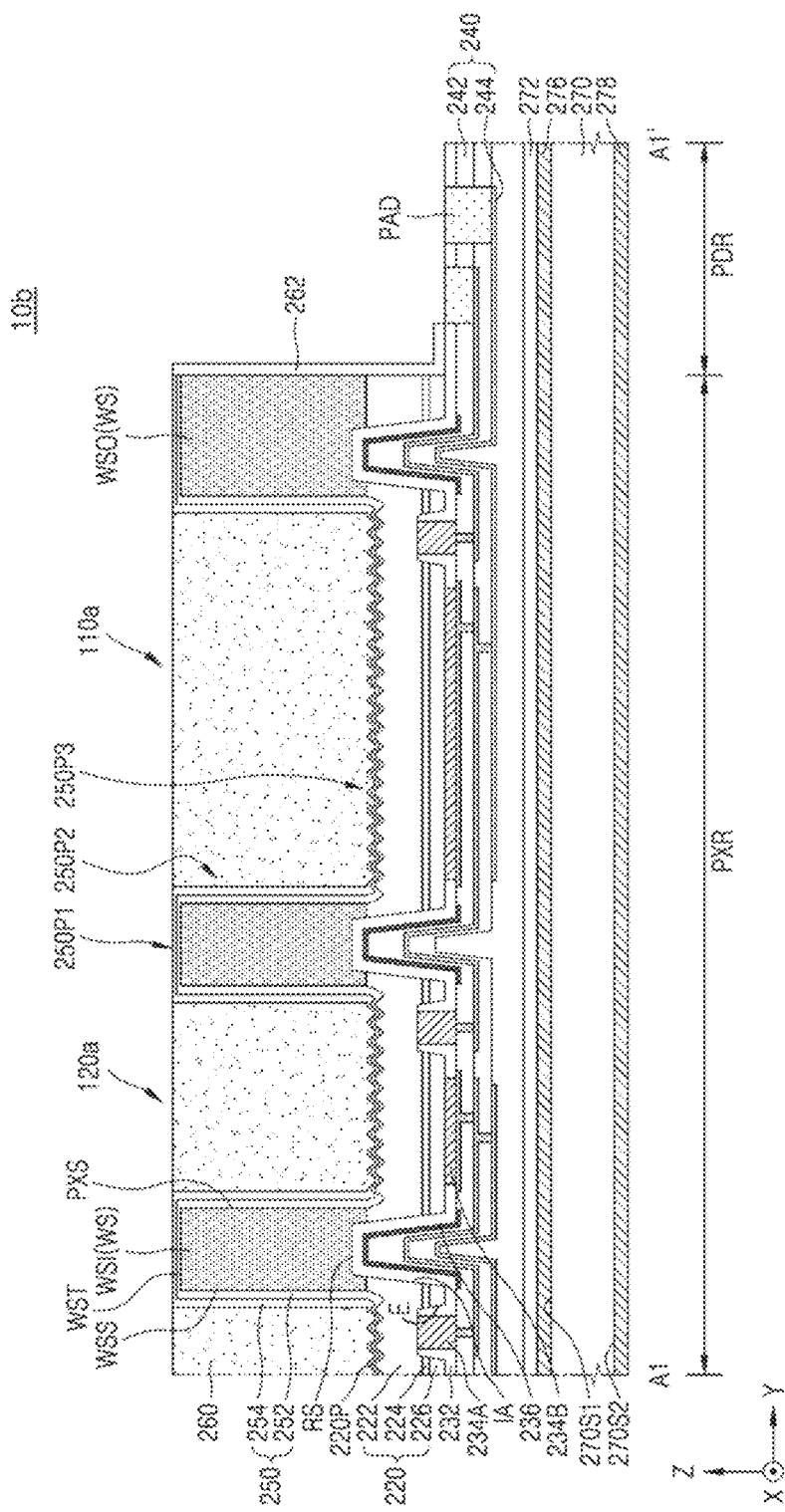
FIG. 11 is a cross-sectional view taken along line A1-A1' of FIG. 10.

FIG. 9 is a plan view of a light-emitting device 10b according to an example embodiment. FIG. 10 is an enlarged view of portion CX1 of FIG. 9. FIG. 11 is a cross-sectional view taken along a line A1-A1' of FIG. 10. Only some components of the light-emitting device 10b are illustrated in FIGS. 9 and 10.

Referring to FIGS. 9 to 11, the light-emitting device 10b may include a light-emitting pixel region PXR and a pad region PDR positioned on at least one side of the light-emitting pixel region PXR. The plurality of pixels PX may be arranged in a matrix form on the light-emitting pixel region PXR, and one or more light-emitting cells 220 may be positioned in each of the pixels PX, respectively. A pad may be arranged on the pad region PDR and electrically connected to a light-emitting cell 220 arranged in each of the pixels PX. Here, the pixel PX may correspond to each of the light-emitting regions 110, 120, and 130 described with reference to FIGS. 1 to 7.

In example embodiments, in a plan view, the light-emitting pixel region PXR may have an area corresponding to about 50% to 90% of the total area of the light-emitting device 10b, and the pad region PDR may have an area corresponding to about 10% to 50% of the total area of the light-emitting device 10b, but embodiments are not limited thereto. In a plan view as shown in FIG. 9, each of the pixels PX may have an X-directional length or Y-directional length of about 10 µm to several mm, but is not limited thereto.

As shown in FIG. 9, in a view from above, the light-emitting device 10b may have a roughly rectangular shape. A length of a first side of the rectangular shape (i.e., an X-directional length LX of the light-emitting device 10b) may be greater than a length of a second side of the rectangular shape (i.e., a Y-directional length LY of the light-emitting device 10b). According to example embodiments, the X-directional length LX of the light-emitting device 10b may be greater than or equal to about 1.1 times the Y-directional length LY. According to example embodiments, the X-directional length LX of the light-emitting device 10b may be less than or equal to about 100 times the Y-directional length LY. According to example embodiments, a thickness T (i.e., a Z-directional length) of the light-emitting device 10b may be several tens of µm to several hundreds of µm. According to example embodiments, a thickness of a light-emitting device 10b may be less than or equal to about 1/10 of the X-directional length LX of the light-emitting device 10b. Because the light-emitting device 10b having the above-described dimensions has dimensions optimized for resistance to physical stress, the warpage of the light-emitting device 10b may be minimized.

The light-emitting device 10b may include a plurality of sub-arrays SA, each of which may include a plurality of pixels PX. For example, FIG. 9 illustrates a case in which the light-emitting device 10b includes 14 sub-arrays SA, each of which includes 12 or 16 pixels PX arranged in a matrix form. However, the arrangement of sub-arrays SA and the number of pixels PX included in each of the plurality of sub-arrays SA may vary.

In example embodiments, the plurality of sub-arrays SA may be electrically isolated from each other, and the plurality of pixels PX included in one sub-array SA may be connected in series to each other. For example, each of the plurality of sub-arrays SA may be electrically connected to the same driver and configured such that one driver chip controls one sub-array SA. In this case, the number of sub-arrays SA may be equal to the number of driver chips. In other embodiments, the pixels PX included in at least one of the plurality of sub-arrays SA may be connected in parallel to each other.

As shown in FIG. 11, partition walls WS may be positioned on the plurality of light-emitting cells 220. As shown in FIG. 10, the partition wall WS may include a plurality of inner partition walls WSI defining a plurality of pixel spaces PXS in the pixel region PXR and an outer partition wall WSO positioned at an outermost portion of the plurality of inner partition walls WSI. Pixels PX may be arranged in the plurality of pixel spaces PXS, respectively.

Each of the plurality of inner partition walls WSI may have a first width w11 of about 10 µm to about 100 µm in a vertical direction (i.e., Y direction). The outer partition wall WSO may have a second width w12 of about 10 µm to about 1 mm in the vertical direction (i.e., the Y direction). The partition wall WS may be formed such that the outer partition wall WSO is formed to have the second width w12 greater than the first width w11 of the plurality of inner partition walls WSI. Thus, the structural stability of the light-emitting device 10b may be improved. For example, even when repetitive vibration and impact are applied to the light-emitting device 10b when the light-emitting device 10b is used as a headlamp for a vehicle, the reliability of the light-emitting device 10b may be improved by excellent structural stability between the partition walls WS and the fluorescent layer 160 positioned within the partition walls WS.

In some embodiments, inner corners of the first, the second, and the third light-emitting regions 110a, 120a, and 130a defined by the partition walls WS may have curved surfaces. That is, the inner corners of the first, the second, and the third light-emitting regions 110a, 120a, and 130a defined by the partition walls WS may have curved shapes having an appropriate radius of curvature as shown, for example, in FIG. 10. The inner corners having the curved shapes may reduce or prevent the occurrence of cracks in the partition walls WS as compared with inner corners, each of which is formed by connecting two planes.

For brevity, as shown in FIG. 11, a surface of the light-emitting cell 220, which faces the plurality of inner partition walls WSI, may be referred to as a top surface of the light-emitting cell 220, while a surface of the light-emitting cell 220 opposite to the top surface of the light-emitting cell 220 (i.e., a surface of the light-emitting cell 220 positioned far from the plurality of inner partition walls WSI) may be referred to as a bottom surface of the light-emitting cell 220.

Each of the plurality of light-emitting cells 220 may include a first conductive semiconductor layer 222, an active layer 224, and a second conductive semiconductor layer 226. An insulating liner 232, a first contact 234A, a second contact 234B, and a wiring structure 240 may be positioned on a bottom surface of each of the plurality of light-emitting cells 220.

For example, the first conductive semiconductor layer 222, the active layer 224, and the second conductive semiconductor layer 226 may be stacked in the vertical direction from the top surface of the light-emitting cell 220 to the bottom surface thereof. Thus, the top surface of the light-emitting cell 220 may correspond to a top surface of the first conductive semiconductor layer 222, and the bottom surface of the light-emitting cell 220 may correspond to a bottom surface of the second conductive semiconductor layer 226.

The first conductive semiconductor layer 222 may be a nitride semiconductor having a composition of n-type $In_xAl_yGa_{(1-x-y)}N$ (where $0 \le x<1$, $0 \le y<1$, and $0 \le x+y<1$). For example, the n-type impurities may be silicon (Si). For example, the first conductive semiconductor layer 222 may include GaN containing n-type impurities.

In example embodiments, the first conductive semiconductor layer 222 may include a first conductive semiconductor contact layer and a current diffusion layer. An impurity concentration of the first conductive semiconductor contact layer may be in the range of $2 \times 10^{18}$ cm$^{-3}$ to $9 \times 10^{19}$ cm$^{-3}$. A thickness of the first conductive semiconductor contact layer may be about 1 µm to about 5 µm. The current diffusion layer may have a structure in which a plurality of $In_xAl_yGa_{(1-x-y)}N$ layers (where $0 \le x$, $y \le 1$, and $0 \le x+y \le 1$) having different compositions or different impurity contents are alternately stacked. For example, the current diffusion layer may have an n-type superlattice structure in which n-type GaN layers and/or $Al_xIn_yGa_zN$ layers (where $0 \le x,y, z \le 1$, and $x+y+z \ne 0$) each having a thickness of about 1 nm to about 500 nm are alternately stacked. An impurity concentration of the current diffusion layer may be in the range of $2 \times 10^{18}$ cm$^{-3}$ to $9 \times 10^{19}$ cm$^{-3}$.

The active layer 224 may be positioned between the first conductive semiconductor layer 222 and the second conductive semiconductor layer 226. The active layer 224 may discharge light having some energy by recombination of electrons and holes during the driving of the light-emitting device 10b. The active layer 224 may have a multiple quantum well (MQW) structure in which quantum well layers and quantum barrier layers are alternately stacked. For example, each of the quantum well layers and each of the quantum barrier layers may include $In_xAl_yGa_{(1-x-y)}N$ layers (where $0≤x$, $y≤1$, and $0≤x+y≤1$) having different compositions. For example, the quantum well layer may include $In_xGa_{1-x}N$ (where $0≤x≤1$), and the quantum barrier layer may include GaN or AlGaN. Thicknesses of the quantum well layer and the quantum barrier layer may be in the range of about 1 nm to about 50 nm. The active layer 224 is not limited to having the MQW structure and may have a single quantum well structure.

The second conductive semiconductor layer 226 may include a nitride semiconductor layer having a composition of p-type $In_xAl_yGa_{(1-x-y)}N$ (where $0≤x<1$, $0≤y<1$, and $0≤x+y<1$). For example, the p-type impurities may be magnesium (Mg).

In example embodiments, the second conductive semiconductor layer 226 may include an electron blocking layer, a low-concentration p-type GaN layer, and a high-concentration p-type GaN layer, which are stacked in a vertical direction. For example, the electron blocking layer may have a structure in which a plurality of $In_xAl_yGa_{(1-x-y)}N$ layers (where $0≤x$, $y≤1$, and $0≤x+y≤1$) having a thickness of about 5 nm to about 100 nm and having different compositions are alternately stacked, or may include a single layer including $Al_yGa_{(1-y)}N$ (where $0<y≤1$). An energy band gap of the electron blocking layer may be reduced as a distance from the active layer 224 increases. For example, aluminum (Al) content in the electron blocking layer may be reduced as the distance from the active layer 224 increases.

Each of the plurality of light-emitting cells 220 may be spaced apart from light-emitting cells 220 adjacent thereto with a device isolation region IA therebetween as shown in FIG. 11.

The insulating liner 232 may be conformally positioned to cover an inner wall of the device isolation region IA and a side surface of each of the plurality of light-emitting cells 220. Also, the insulating liner 232 may be positioned on an inner wall of the opening E, which completely passes through the active layer 224 and the second conductive semiconductor layer 226. In example embodiments, the insulating liner 232 may include silicon oxide, silicon oxynitride, or silicon nitride. In some embodiments, the insulating liner 232 may have a structure in which a plurality of insulating layers are stacked.

The first contact 234A may be connected to the first conductive semiconductor layer 222 in the opening E penetrating the active layer 224 and the second conductive semiconductor layer 226. The second contact 234B may be positioned on the bottom surface of the second conductive semiconductor layer 226. The insulating liner 232 may electrically insulate the first contact 234A from the active layer 224 and the second conductive semiconductor layer 226. The insulating liner 232 may be positioned between the first contact 234A and the second contact 234B on the bottom surface of the second conductive semiconductor layer 226 and electrically insulate the first contact 234A from the second contact 234B. Each of the first contact 234A and the second contact 234B may include silver (Ag), aluminum (Al), nickel (Ni), chromium (Cr), gold (Au), platinum (Pt), palladium (Pd), tin (Sn), tungsten (W), rhodium (Rh), iridium (Ir), ruthenium (Ru), magnesium (Mg), zinc (Zn), titanium (Ti), copper (Cu), or a combination thereof. Each of the first contact 234A and the second contact 234B may include a metal material having high reflectivity.

A lower reflective layer 236 may be positioned on the insulating liner 232 positioned on the inner wall of the device isolation region IA. The lower reflective layer 236 may reflect light emitted from sidewalls of the plurality of light-emitting cells 220 and reflect the reflected light into the plurality of pixel spaces PXS.

In example embodiments, the lower reflective layer 236 may include Ag, Al, Ni, Cr, Au, Pt, Pd, Sn, W, Rh, Ir, Ru, Mg, Zn, Ti, Cu, or a combination thereof. The lower reflective layer 236 may include a metal material having high reflectivity. In other embodiments, the lower reflective layer 236 may include a distributed Bragg reflector. For example, the distributed Bragg reflector may have a structure in which a plurality of insulating layers having different refractive indexes are repeatedly stacked. Each of the insulating layers in the distributed Bragg reflector may include oxide, nitride, or a combination thereof, for example, $SiO_2$, SiN, $SiO_xN_y$, $TiO_2$, $Si_3N_4$, $Al_2O_3$, TiN, AlN, $ZrO_2$, TiAlN, or TiSiN.

A wiring structure 240 may be arranged on the insulating liner 232, the first contact 234A, the second contact 234B, and the lower reflective layer 236. The wiring structure 240 may include a plurality of insulating layers 242 and a plurality of wiring layers 244. The plurality of wiring layers 244 may electrically connect each of the first contact 234A and the second contact 234B to the pad PAD. Some of the plurality of wiring layers 244 may be positioned on the inner wall of the device isolation region IA, and the plurality of insulating layers 242 may respectively cover the plurality of wiring layers 244 and fill the device isolation region IA. As shown in FIG. 11, the plurality of wiring layers 244 may include at least two wiring layers 244 located at different levels in the vertical direction, but are not limited thereto. Each of the plurality of wiring layers 244 may include Ag, Al, Ni, Cr, Au, Pt, Pd, Sn, W, Rh, Ir, Ru, Mg, Zn, Ti, Cu, or a combination thereof.

In example embodiments, the plurality of light-emitting cells 220 included in one sub-array SA may be connected in series to each other. To that end, the plurality of wiring layers 244 may electrically connect the first contact 234A of one light-emitting cell 220 to the second contact 234B of another light-emitting cell 220 connected in series to the one light-emitting cell 220.

The pad PAD may be positioned on the pad region PDR and connected to the plurality of wiring layers 244. The pad PAD may be positioned at a lower vertical level than the partition wall WS. In example embodiments, a sidewall and a bottom surface of the pad PAD may be covered by the plurality of insulating layers 242, and a top surface of the pad PAD may be positioned at a lower level than the top surfaces of the plurality of light-emitting cells 220. In other embodiments, unlike those shown in FIG. 11, some of the plurality of light-emitting cells 220 may be positioned in the pad region PDR, and the pad PAD may be positioned in openings formed in the plurality of light-emitting cells 220. In this case, the top surface of the pad PAD may be positioned at the same level as the top surfaces of the plurality of light-emitting cells 220. Connection members (e.g., bonding wires) for electrical connection with a driver semiconductor chip may be positioned on the pad PAD.

The partition walls WS may be positioned on the top surfaces of the plurality of light-emitting cells 220. The partition walls WS may include silicon (Si), silicon carbide (SiC), sapphire ($Al_2O_3$), or gallium nitride (GaN). In an example process, after the plurality of light-emitting cells 220 are formed on a substrate (refer to 210 in FIG. 12A), the partition walls WS may be formed by removing portions of the substrate 210. In this case, the partition walls WS may be portions of the substrate 210, which serve as a growth substrate for forming the light-emitting cells 220.

The plurality of inner partition walls WSI may extend in two directions (e.g., an x direction and a y direction), which are orthogonal to each other in a plan view, and define the plurality of pixel spaces PXS in a matrix form. Each of the plurality of inner partition walls WSI may include a recess region RS, which is positioned to vertically overlap the device isolation region IA at a bottom of each of the plurality of inner partition walls WSI. The recess region RS may be formed by removing a portion of the substrate 210 (see FIG. 12B) together during an etching process for separating a light-emitting stack (refer to 220L in FIG. 12A) into the plurality of light-emitting cells 220. The insulating liner 232 may be arranged to contact the recess region RS on a bottom surface of each of the plurality of inner partition walls WSI.

The top surfaces of the plurality of light-emitting cells 220 may be exposed at bottoms of the plurality of pixel spaces PXS. For example, a concave/convex portion 220P may be formed in the top surfaces of the plurality of light-emitting cells 220 positioned at the bottoms of the plurality of pixel spaces PXS. Light extraction efficiency of the plurality of light-emitting cells 220 may be improved by the concave/convex portion 220P, but embodiment are not limited thereto.

A passivation structure 250 may be positioned on a top surface WST and a sidewall WSS of each of the plurality of inner partition walls WSI. The passivation structure 250 may include a first passivation layer 252 and a second passivation layer 254, which are conformally positioned on the top surface WST and the sidewall WSS of each of the plurality of inner partition walls WSI. The passivation structure 250 may also be conformally positioned on the top surfaces of the light-emitting cells 220 (e.g., on the concave/convex portion 220P) positioned at the bottoms of the plurality of pixel spaces PXS.

In example embodiments, the first passivation layer 252 may include a first insulating material, and the second passivation layer 254 may include a second insulating material that is different from the first insulating material. Each of the first insulating material and the second insulating material may include at least one of silicon oxide, silicon nitride, silicon oxynitride, aluminum oxide, and aluminum nitride. Although FIG. 11 illustrates an example in which two passivation layers are provided, it will be understood by one skilled in the art that at least three passivation layers may be provided. In some embodiments, when a plurality of passivation layers are provided, materials of adjacent passivation layers may be differently selected.

In some example embodiments, the first passivation layer 252 and the second passivation layer 254 may be repeatedly stacked as pairs of passivation layers at least twice.

In example embodiments, the passivation structure 250 may include a first portion 250P1 positioned on the top surface WST of each of the plurality of inner partition walls WSI, a second portion 250P2 positioned on the sidewall WSS of each of the plurality of inner partition walls WSI, and a third portion 250P3 arranged on the top surfaces of the light-emitting cells 220. In some embodiments, a thickness of the first portion 250P1 may be less than or equal to a thickness of the second portion 250P2. Also, a thickness of the third portion 250P3 may be less than or equal to the thickness of the second portion 250P2. In some embodiments, the first portion 250P1 may have a thickness of about 0.1 μm to about 2 μm, and the second portion 250P2 may have a thickness of about 0.5 μm to 5 μm.

A fluorescent layer 260 may be positioned inside the plurality of pixel spaces PXS on the top surfaces of the plurality of light-emitting cells 220. As shown in FIG. 3, the fluorescent layer 260 may fill substantially the total space of the plurality of pixel spaces PXS on the passivation structure 250. A top surface of the fluorescent layer 260 may be at the same level as the top surface WST of each of the plurality of inner partition walls WSI, but embodiments are not limited thereto.

The fluorescent layer 260 may include a single material capable of converting the color of light emitted from the light-emitting cell 220 into a desired color. That is, a fluorescent layer 260 associated with the same color may be positioned in the plurality of pixel spaces PXS. However, embodiments are not limited thereto. The color of a fluorescent layer 260 positioned in some of the plurality of pixel spaces PXS may be different from the color of a fluorescent layer 260 positioned in the remaining pixel spaces PXS. In other words, two or more colors may be represented in the plurality of pixel spaces PXS.

The fluorescent layer 260 may include a resin containing a fluorescent material dispersed therein or a film containing a fluorescent material. For example, the fluorescent layer 260 may include a fluorescent material film in which fluorescent material particles are uniformly dispersed at a certain concentration. The fluorescent material particles may be a wavelength conversion material that changes the wavelength of light emitted from the plurality of light-emitting cells 220. The fluorescent layer 260 may include at least two kinds of fluorescent material particles having different size distributions to improve the density and color uniformity of the fluorescent material particles.

In example embodiments, the fluorescent material may have various colors and various compositions such as an oxide-based composition, a silicate-based composition, a nitride-based composition, and a fluoride-based composition. For example, $\beta$-SiAlON:$Eu^{2+}$(green), (Ca, Sr)$AlSiN_3$:$Eu^{2+}$(red), $La_3Si_6N_{11}$:$Ce^{3+}$(yellow), $K_2SiF_6$:$Mn_4^+$(red), $SrLiAl_3N_4$:Eu(red), $Ln_{4-x}(Eu_zM_{1-z})_xSi_{12-y}Al_yO_{3+x+y}N_{18-x-y}$ ($0.5 \leq x \leq 3$, $0 < z < 0.3$, $0 < y \leq 4$)(red), $K_2TiF_6$:$Mn_4^+$(red), $NaYF_4$:$Mn_4^+$(red), $NaGdF_4$:$Mn_4^+$(red), and the like may be used as the fluorescent material. However, the kind of the fluorescent material is not limited thereto.

In some embodiments, a wavelength conversion material such as a quantum dot may be further positioned over the fluorescent layer 260. The quantum dot may have a core-shell structure using a III-V or II-VI compound semiconductor. For example, the quantum dot may have a core such as CdSe and InP and a shell such as ZnS and ZnSe. In addition, the quantum dot may include a ligand for stabilizing the core and the shell.

A support substrate 270 may be positioned on a bottom of the wiring structure 240, and an adhesive layer 272 may be positioned between the support substrate 270 and the wiring structure 240. In example embodiments, the adhesive layer 272 may include an electrically insulating material, for example, silicon oxide, silicon nitride, a polymer material such as a UV-curable material, or resin. In some embodiments, the adhesive layer 272 may include a eutectic adhesive material, such as AuSn or NiSi.

The support substrate 270 may include an insulating substrate or a conductive substrate. In example embodiments, the support substrate 270 may have an electric resistance of at least several MΩ for example, at least 50 MΩ. The greater the electrical resistance of the support substrate 270, the better electrical insulating characteristics of the support substrate 270. For example, the support substrate 270 may include doped silicon, an undoped sapphire substrate, a glass substrate, a transparent conductive substrate, a silicon substrate, a silicon carbide substrate, $Al_2O_3$, tungsten (W), copper (Cu), a bismaleimide triazine (BT) resin, an epoxy resin, polyimide, a liquid crystal (LC) polymer, a copper clad laminate, or a combination thereof, but embodiments are not limited thereto.

In example embodiments, the support substrate 270 may have a thickness of at least 150 μm (e.g., about 200 μm to about 400 μm) in a vertical direction (i.e., the Z direction of FIG. 11). When the support substrate 270 has an excessively small thickness, emission characteristics of the light-emitting device 10*b* may be adversely affected. For example, the warpage of the support substrate 270 may occur. When the support substrate 270 has an excessively great thickness, components around the support substrate 270 may be deformed due to stress caused by the support substrate 270.

An upper insulating film 276 and a lower insulating film 278 may be further provided on either surface of the support substrate 270.

The upper insulating film 276 may cover a first surface 270S1 of the support substrate 270, which faces the wiring structure 240, and the lower insulating film 278 may cover a second surface 270S2 of the support substrate 270, which is an opposite side of the first surface 270S1. The upper insulating film 276 may be spaced apart from the wiring structure 240 with the adhesive layer 272 therebetween in the vertical direction (e.g., the Z direction). In example embodiments, the upper insulating film 276 may be in contact with the first surface 270S1 of the support substrate 270, and the lower insulating film 278 may be in contact with the second surface 270S2 of the support substrate 270. However, embodiments are not limited thereto. For example, at least one middle film may be interposed between the upper insulating film 276 and the support substrate 270 and/or between the lower insulating film 278 and the support substrate 270. The at least one middle film may include an insulating material, a semiconductor material, a conductive material, or a combination thereof.

The light-emitting device 10*b* (or the headlamp) according to an embodiment may be manufactured in a simple, inexpensive manner with a low operation control burden of each light-emitting region.

FIGS. 12A to 12M are cross-sectional views illustrating a method of manufacturing a light-emitting device 10*b*, according to a process sequence, according to example embodiments. FIGS. 12A to 12M are cross-sectional views taken along a line A1-A1' of FIG. 10.

Figure 12A:
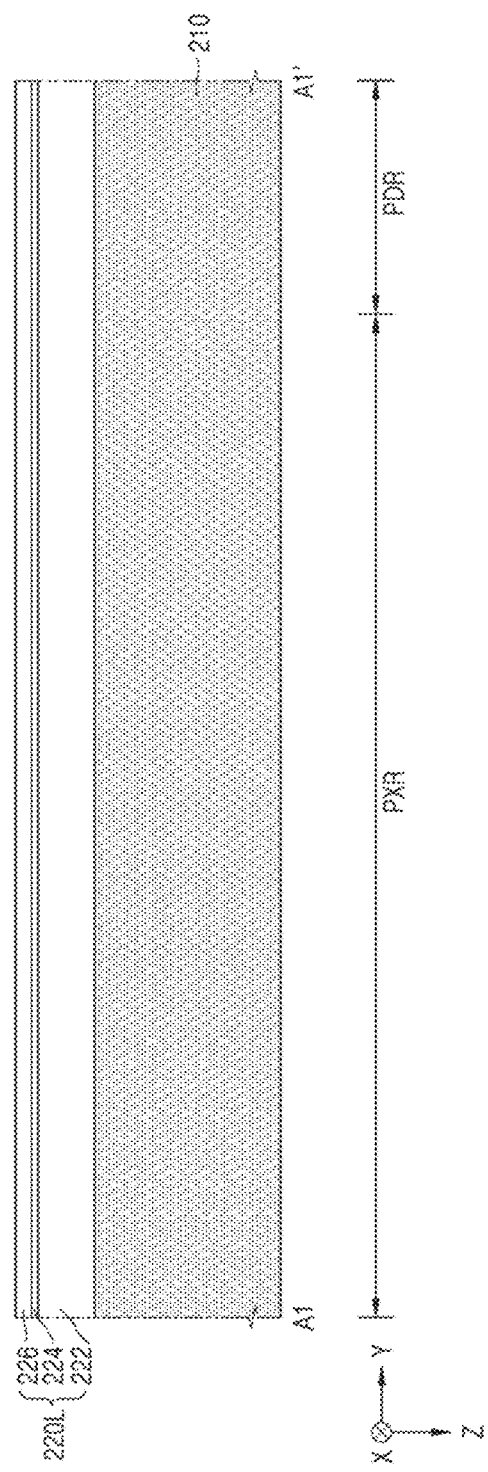

Referring to FIG. 12A, a light-emitting stack 220L may be formed on a substrate 210.

In example embodiments, the substrate 210 may include a silicon (Si) substrate, a silicon carbide (SiC) substrate, a sapphire substrate, and/or a gallium nitride (GaN) substrate. The substrate 210 may include a pixel region PXR and a pad region PDR. In a plan view, the pad region PDR may be arranged on at least one side of the pixel region PXR, for example, on either side or both sides of the pixel region PXR or around the pixel region PXR.

The light-emitting stack 220L may include a first conductive semiconductor layer 222, an active layer 224, and a second conductive semiconductor layer 226, which are sequentially formed on a top surface of the substrate 210.

Figure 12B:
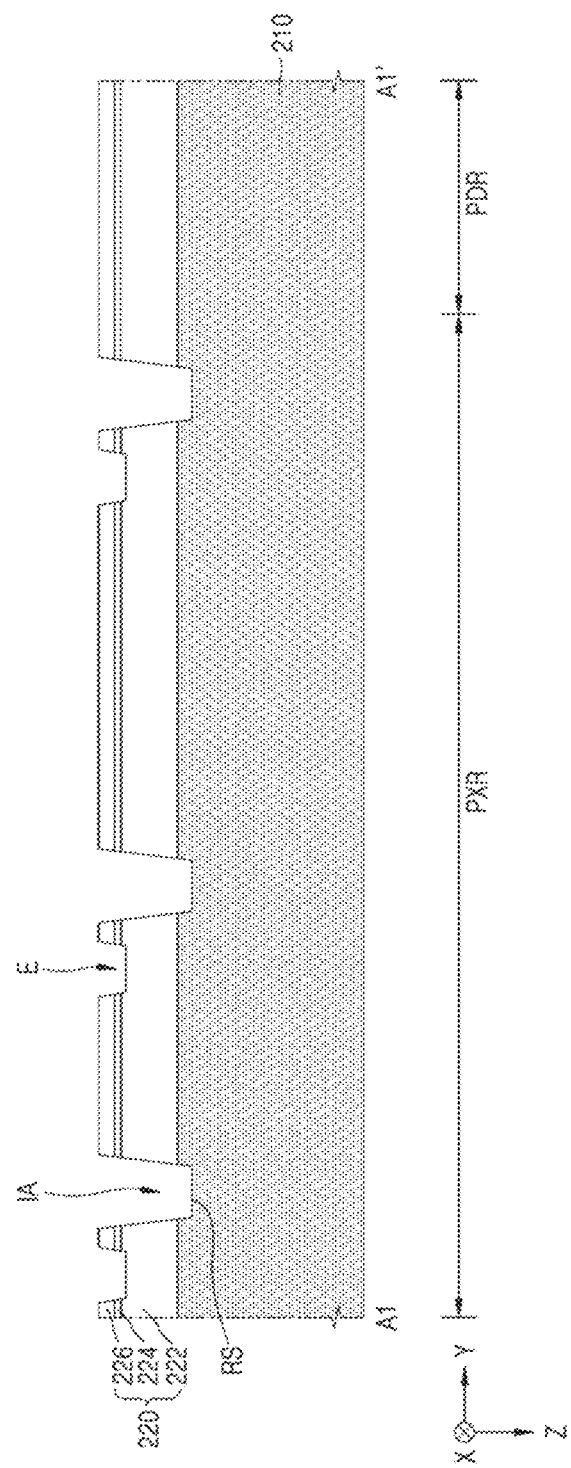

Referring to FIG. 12B, a mask pattern may be formed on the light-emitting stack 220L, and a portion of the light-emitting stack 220L may be removed using the mask pattern as an etching mask and thus an opening E may be formed. The opening E may expose a top surface of the first conductive semiconductor layer 222. The opening E may not be formed on the pad region PDR of the substrate 210.

Thereafter, a mask pattern may be formed, and a portion of the light-emitting stack 220L may be removed using the mask pattern as an etch mask, and thus, a device isolation region IA may be formed. In this case, a plurality of light-emitting cells 220 may be formed and separated from each other by the device isolation region IA.

In example embodiments, a process of forming the device isolation region IA may be performed by a blade, but is not limited thereto. As shown in FIG. 12B, a cross-sectional shape of each of the plurality of light-emitting cells 220 obtained by the process of forming the device isolation region IA may be a trapezoid shape whose upper width is less than a lower width thereof. The isolation region IA may be an inverse trapezoid shape whose upper width is greater than a lower width thereof. However, embodiments are not limited thereto. A portion of the substrate 210 may be removed together during the process of forming the device isolation region IA, and thus, a recess region RS may be formed in the substrate 210.

Referring to FIG. 12C, an insulating liner 232 may be formed to conformally cover the plurality of light-emitting cells 220. Thereafter, a portion of the insulating liner 232 may be removed to expose a top surface of the second conductive semiconductor layer 226, and a second contact 234B may be formed on the exposed top surface of the second conductive semiconductor layer 226. The second contact 234B may be formed using Ag, Al, Ni, Cr, Au, Pt, Pd, Sn, W, Rh, Ir, Ru, Mg, Zn, Ti, Cu and a combination thereof. In some embodiments, before the second contact 234B is formed, an ohmic metal layer including a conductive ohmic material may be further formed on the top surface of the second conductive semiconductor layer 226.

Subsequently, a portion of the insulating liner 232 may be removed inside the opening E to expose a top surface of the first conductive semiconductor layer 222, and a first contact 234A may be formed on the exposed top surface of the first conductive semiconductor layer 222. The first contact 234A may be formed using Ag, Al, Ni, Cr, Au, Pt, Pd, Sn, W, Rh, Ir, Ru, Mg, Zn, Ti, Cu or a combination thereof. In some embodiments, before the first contact 234A is formed, an ohmic metal layer including a conductive ohmic material may be further formed on the top surface of the first conductive semiconductor layer 222.

Thereafter, a lower reflective layer 236 may be formed on the insulating liner 232 along an inner wall of the device isolation region IA. In other embodiments, the lower reflective layer 236 may be formed during the formation of the first contact 234A or may be formed during the formation of the second contact 234B.

Figure 12D:
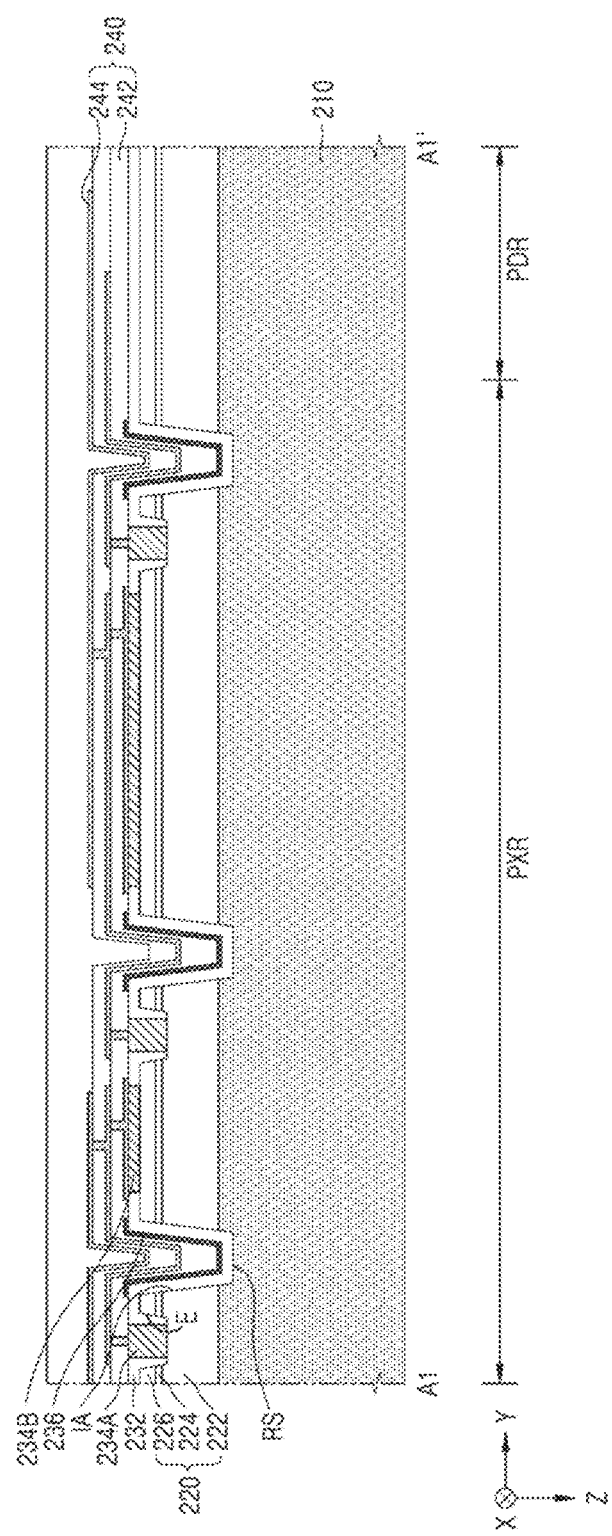

Referring to FIG. 12D, a wiring structure 240 may be formed on the insulating liner 232, the first contact 234A, the second contact 234B, and the lower reflective layer 236. For example, a conductive layer may be formed on the insulating liner 232, the first contact 234A, the second contact 234B, and the lower reflective layer 236. The conductive layer may be patterned to form a wiring layer 244, and an insulating layer 242 may be formed to cover the wiring layer 244. By repeating the processes of forming the wiring layer 244 and the insulating layer 242, the wiring structure 240 including a plurality of wiring layers 244 and a plurality of insulating layers 242 may be formed. In example embodiments, at least some of the plurality of wiring layers 244 may be formed using a plating process.

Figure 12E:
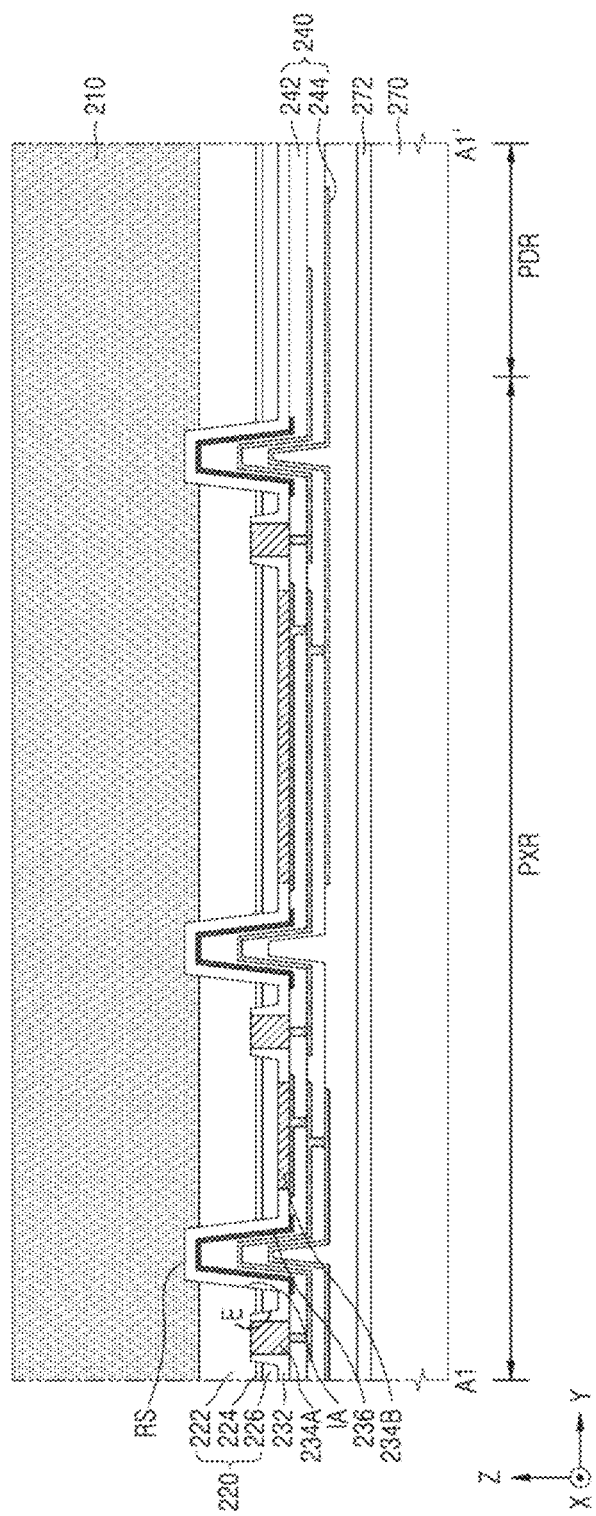

Referring to FIG. 12E, an adhesive layer 272 may be formed on the wiring structure 240, and a support substrate 270 may be attached onto the adhesive layer 272. Thereafter, the light-emitting cells 220 attached to the support substrate 270 may be reversed such that a surface opposite to a surface of the substrate 210, which is in contact with the light-emitting cells 220, faces upward. Then, the top surface of the substrate 210 may be partially removed using a grinding process.

Referring to FIG. 12F, a mask pattern may be formed on the substrate 210, and portions of the substrate 210 may be removed using the mask pattern as an etch mask, and thus, a plurality of pixel spaces PXS may be formed on the pixel region PXR of the substrate 210. Portions of the substrate 210, which are arranged between the plurality of pixel spaces PXS in the pixel region PXR may be referred to as a plurality of inner partition walls WSI.

The plurality of inner partition walls WSI may be positioned to vertically overlap the device isolation region IA, and the plurality of light-emitting cells 220 may be arranged in the plurality of pixel spaces PXS, respectively. The top surface of the first conductive semiconductor layer 222 (i.e., top surfaces of the plurality of light-emitting cells 220) may be exposed at bottoms of the plurality of pixel spaces PXS.

Thereafter, an etching process may be performed on the first conductive semiconductor layer 222 exposed at the bottoms of the plurality of pixel spaces PXS, and thus, concave/convex portions 220P may be formed. However, in other embodiments, the etching process for forming the concave/convex portions 220P may be omitted.

Figure 12G:
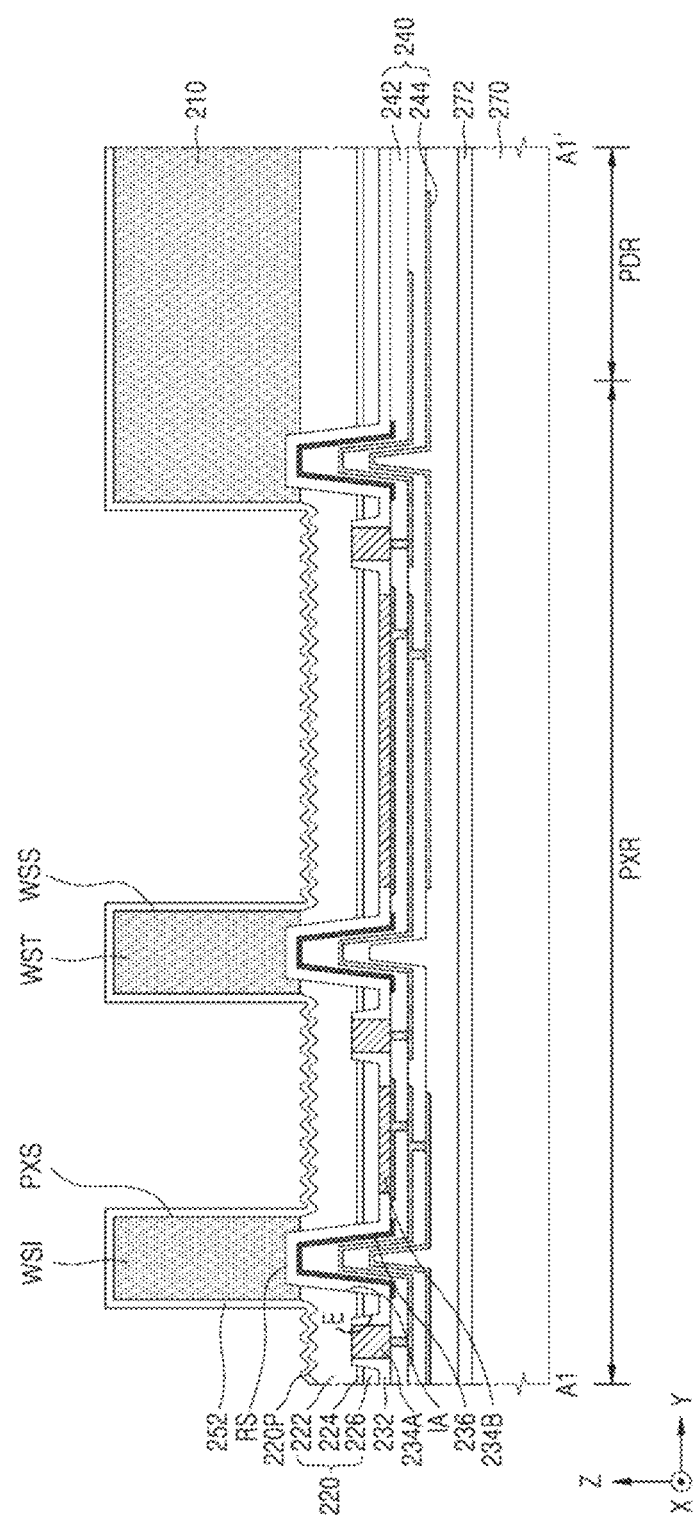

Referring to FIG. 12G, a first passivation layer 252 may be formed on the plurality of inner partition walls WSI and the substrate 210. The first passivation layer 252 may be formed on top surfaces WST and sidewalls WSS of the plurality of inner partition walls WSI and on the top surfaces of the plurality of light-emitting cells 220.

In example embodiments, the first passivation layer 252 may be formed using a first insulating material, which is at least one of silicon oxide, silicon nitride, silicon oxynitride, aluminum oxide, and aluminum nitride. The first passivation layer 252 may be formed using an atomic layer deposition (ALD) process or a chemical vapor deposition (CVD) process.

Figure 12H:
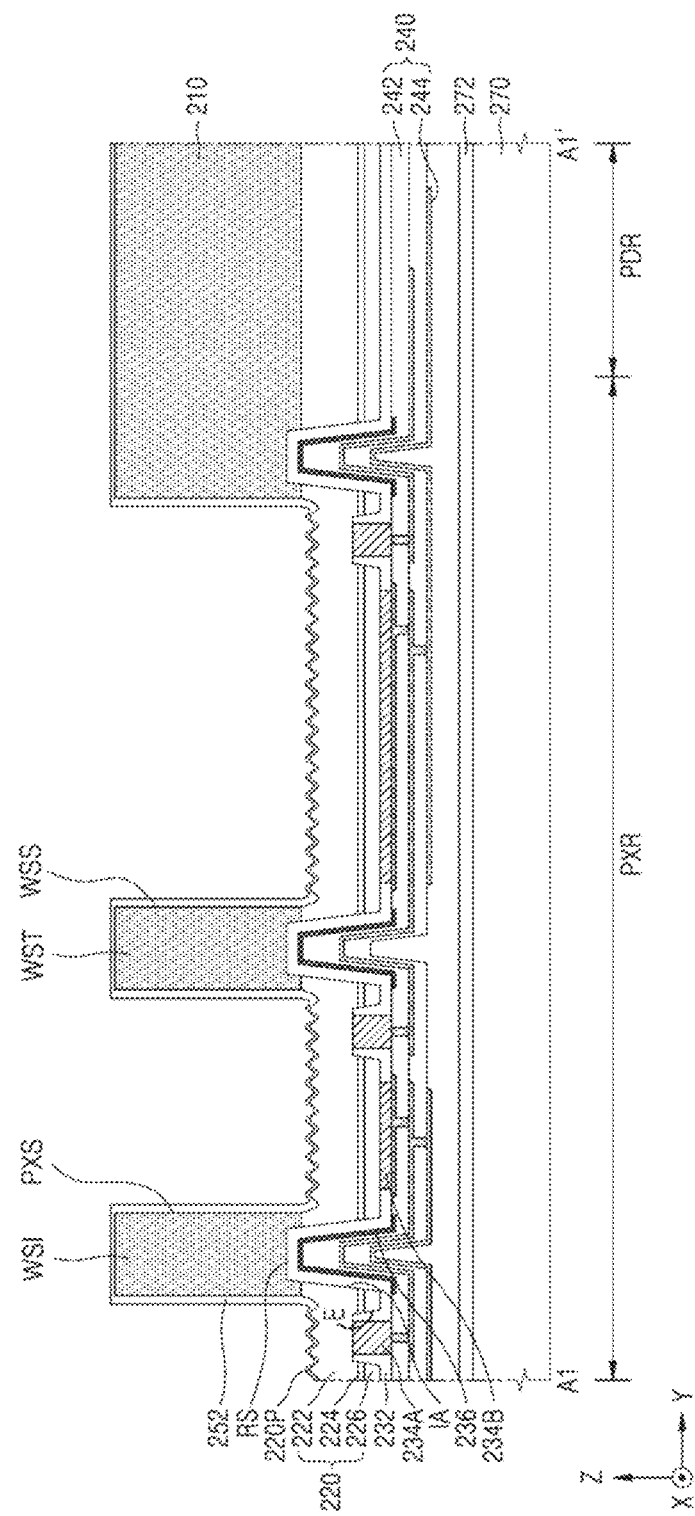

Referring to FIG. 12H, an anisotropic etching process or a trimming process may be performed on the first passivation layer 252, and thus, a thickness of the first passivation layer 252 positioned on the top surfaces WST of the plurality of inner partition walls WSI and the top surfaces of the plurality of light-emitting cells 220 may be reduced. The thickness of the first passivation layer 252 positioned on the sidewalls WSS of the plurality of inner partition walls WSI may not be reduced.

In some embodiments, portions of the first passivation layer 252, which are positioned on the top surfaces WST of the plurality of inner partition walls WSI and the top surfaces of the plurality of light-emitting cells 220, may be completely removed. The first passivation layer 252B may be left on the sidewalls WSS of the plurality of inner partition walls WSI. In some other embodiments, the anisotropic etching process or the trimming process on the first passivation layer 252 may be omitted.

Figure 12I:
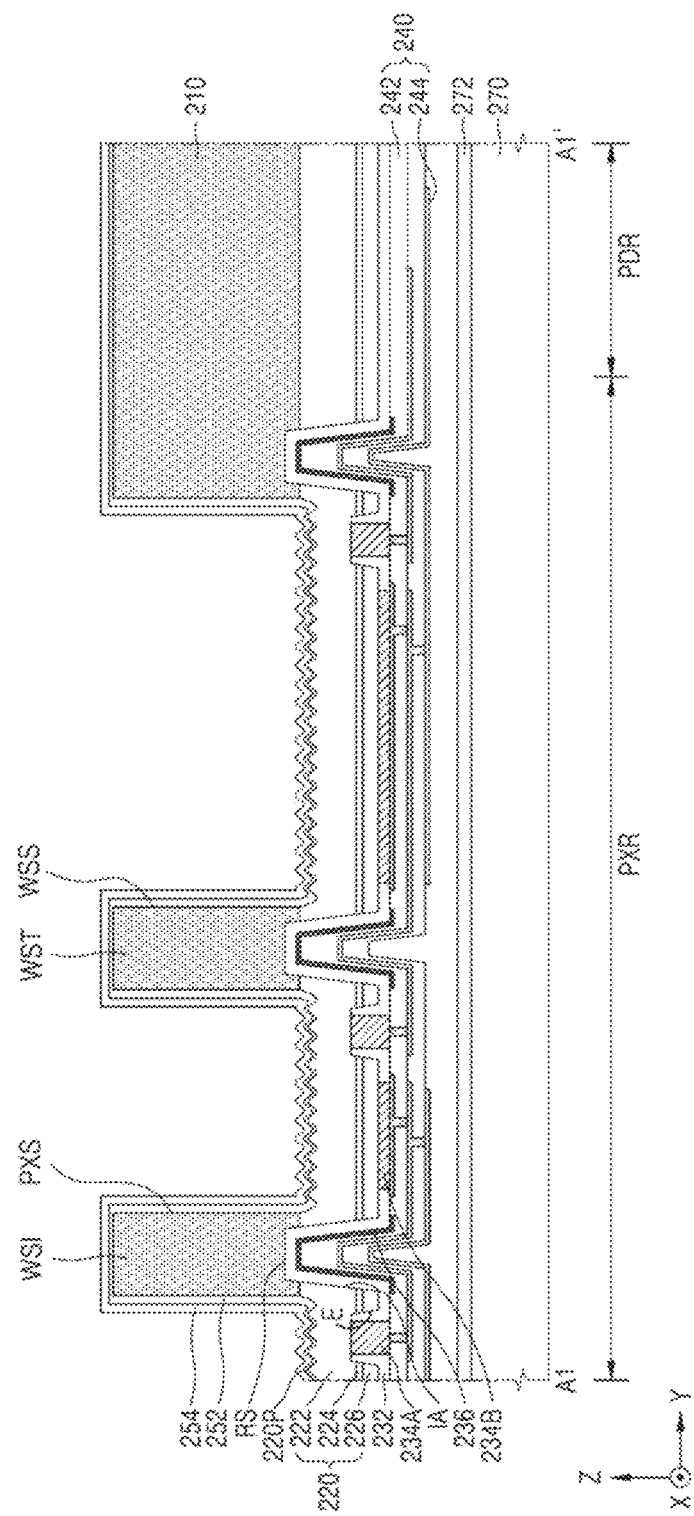

Referring to FIG. 12I, a second passivation layer 254 may be formed on the first passivation layer 252. The second passivation layer 254 may be formed on the top surfaces WST and the sidewalls WSS of the plurality of inner partition walls WSI and the top surfaces of the plurality of light-emitting cells 220.

In example embodiments, the second passivation layer 254 may be formed using a second insulating material, which is at least one of silicon oxide, silicon nitride, silicon oxynitride, aluminum oxide, and aluminum nitride. The second insulating material may be different from the first insulating material included in the first passivation layer 252. The second passivation layer 254 may be formed using an ALD process or a CVD process.

Figure 12J:
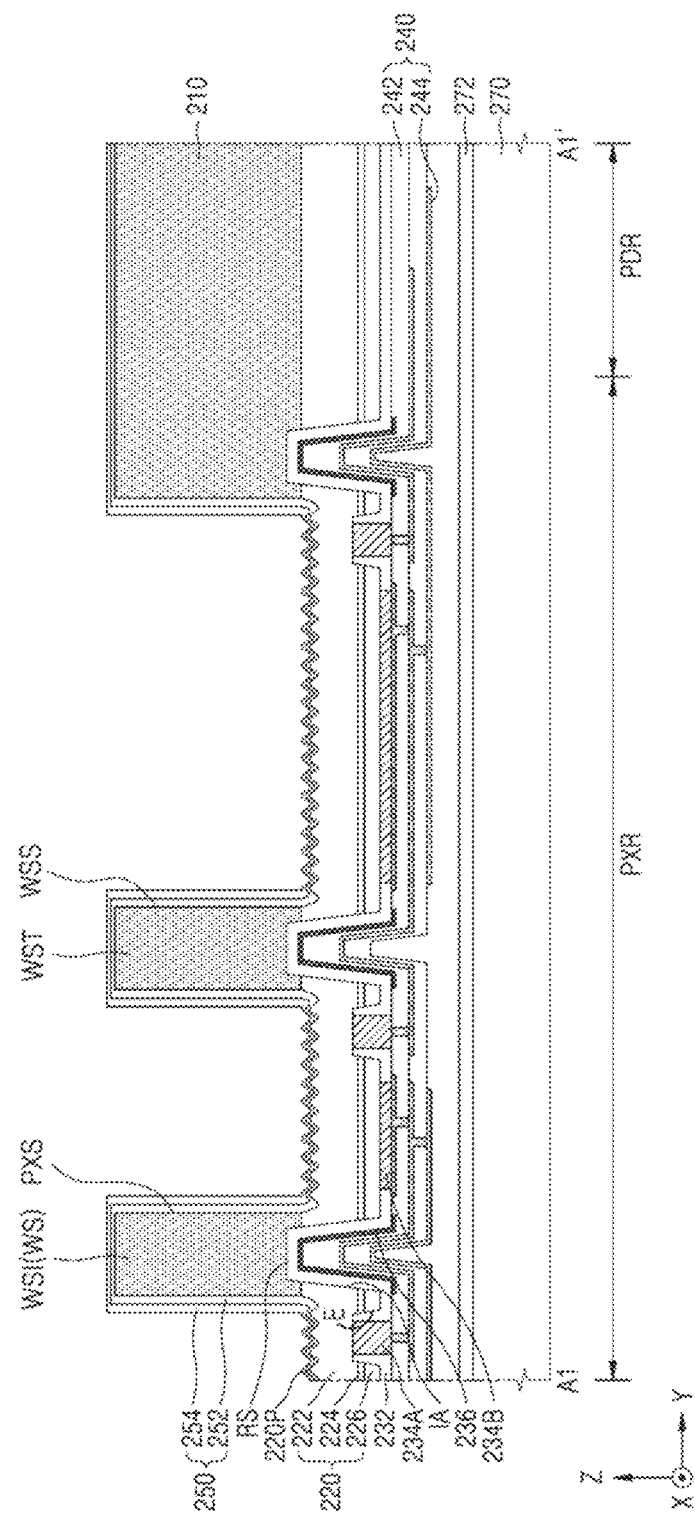

Referring to FIG. 12J, an anisotropic etching process or a trimming process may be performed on the second passivation layer 254, and thus, a thickness of the second passivation layer 254 positioned on the top surfaces WST of the plurality of inner partition walls WSI and the top surfaces of the plurality of light-emitting cells 220 may be reduced. The thickness of the second passivation layer 254 positioned on the sidewalls WSS of the plurality of inner partition walls WSI may not be reduced. In some other embodiments the anisotropic etching process or the trimming process on the second passivation layer 254 may be omitted.

In some other embodiments, portions of the second passive layer 254, which are positioned on the top surfaces WST of the plurality of inner partition walls WSI and the top surfaces of the plurality of light-emitting cells 220, may be completely removed. The second passivation layer 254 may be left on the sidewalls WSS of the plurality of inner partition walls WSI.

In some other embodiments, a third passivation layer may be further formed on the second passivation layer 254.

In some other embodiments, a conductive layer may be formed on the top surface of the substrate 210 and on inner walls of the plurality of pixel spaces PXS, and an anisotropic etching process may be performed on the conductive layer to thereby form a sidewall reflective layer on the sidewalls of the plurality of pixel spaces PXS (or the sidewall of the second passivation layer 254). Thereafter, a protective layer may be formed on the sidewall reflective layer 264 and on the inner walls of the plurality of pixel spaces PXS.

Figure 12K:
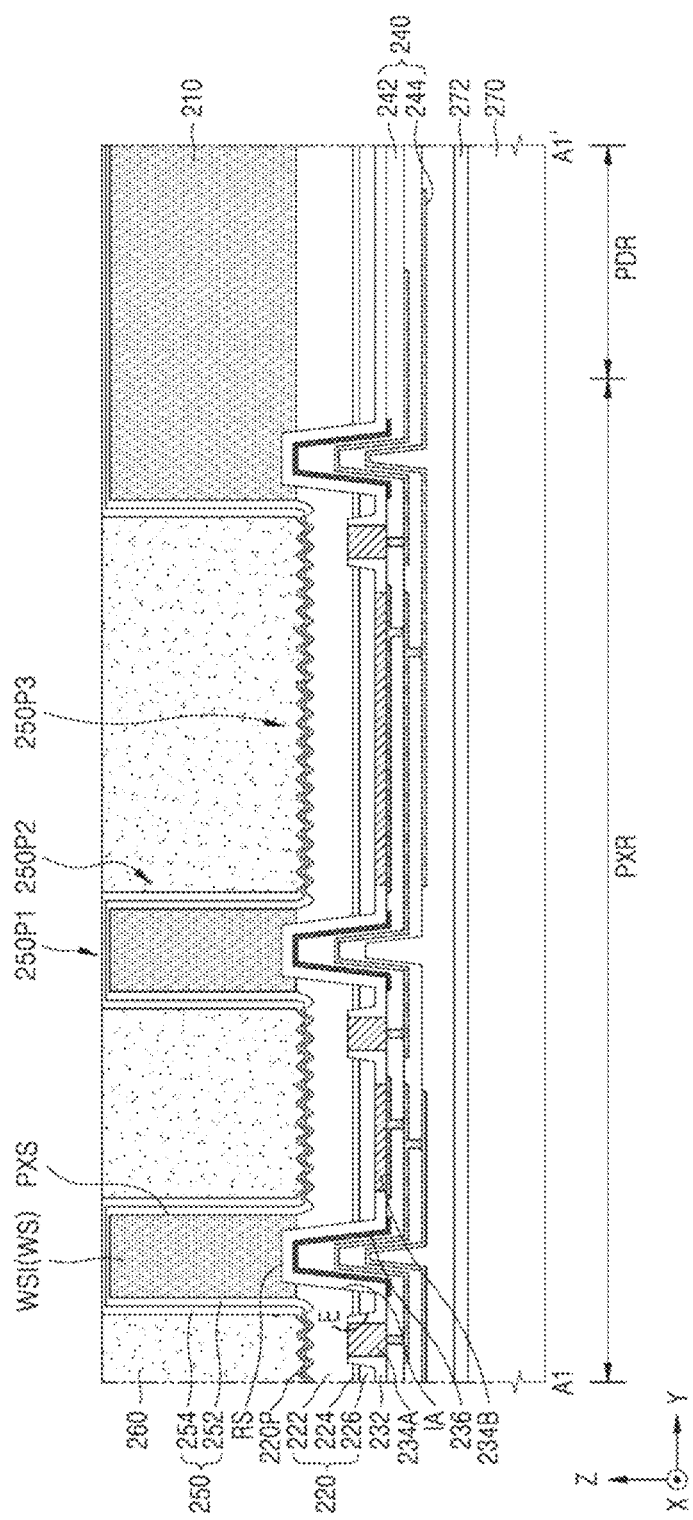

Referring to FIG. 12K, a fluorescent layer 260 may be formed to fill the plurality of pixel spaces PXS.

In example embodiments, the fluorescent layer 260 may be formed by applying or dispensing a resin containing fluorescent material particles dispersed therein into the plurality of pixel spaces PXS.

Figure 12L:
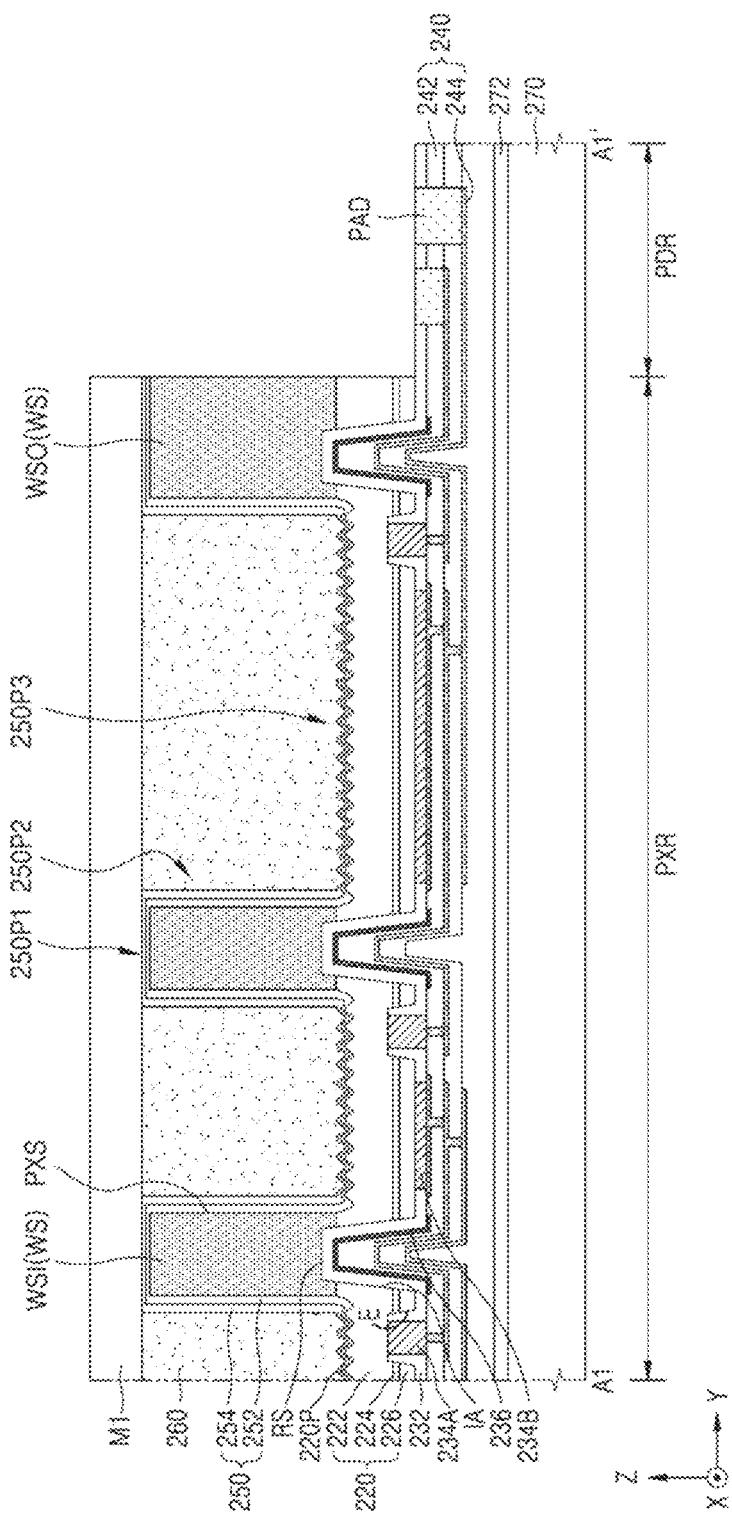

Referring to FIG. 12L, a mask pattern M1 may be formed to cover the fluorescent layer 260 and the plurality of inner partition walls WSI in the pixel region PXR. A portion of the substrate 210 may be removed using the mask pattern M1 as an etch mask, and thus, an outer partition wall WSO may be formed.

Thereafter, the light-emitting stack 220L exposed outside the outer partition wall WSO may be removed to expose the wiring structure 240. Afterwards, an opening may be formed in the wiring structure 240 and filled with a conductive material to form a pad PAD.

Figure 12M:
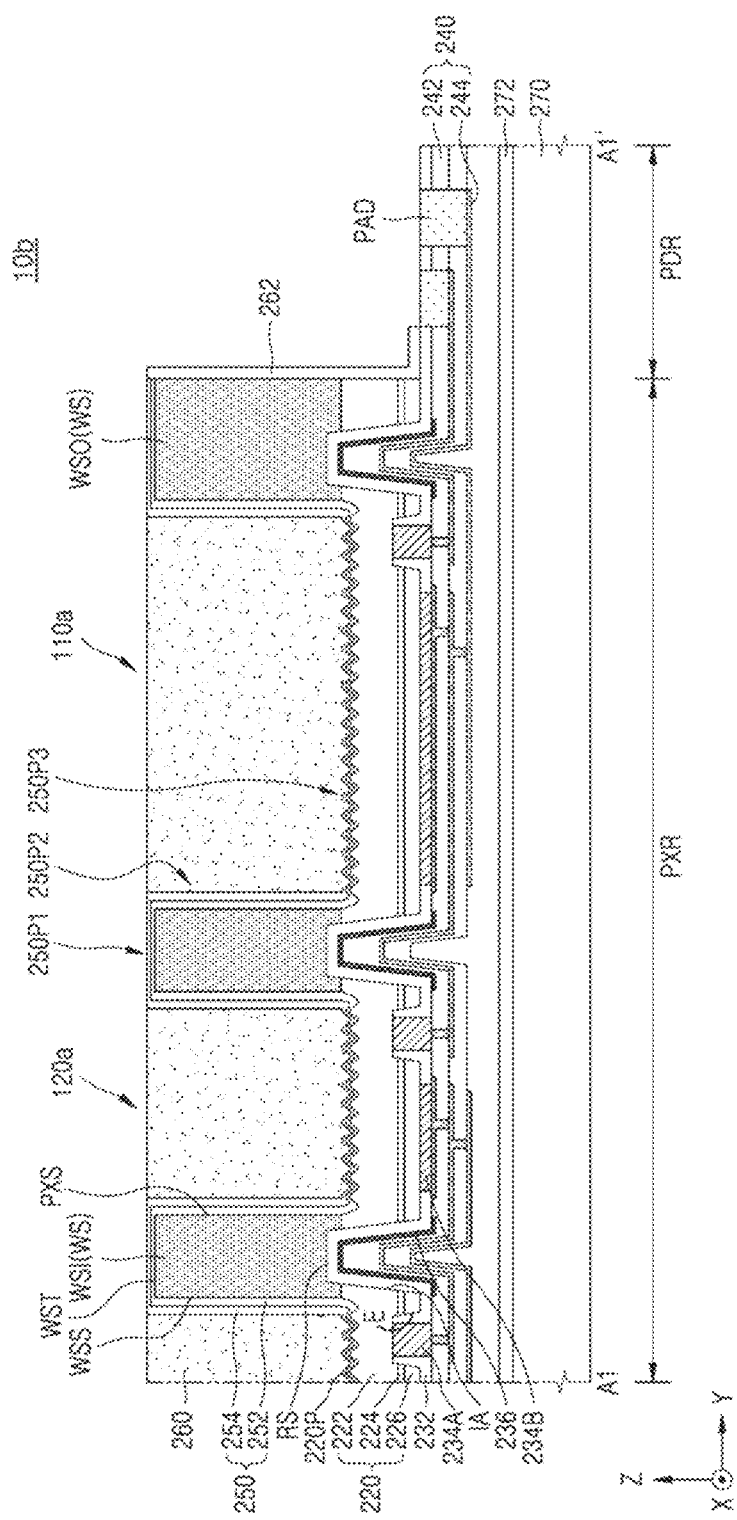

Referring to FIG. 12M, the mask pattern M1 may be removed. Subsequently, an edge protective layer 262 may be formed using an insulating material on an outer sidewall of the outer partition wall WSO. The edge protective layer 262 may wholly or partially cover a top surface of the pad PAD.

The light-emitting device 10b may be manufactured using the above-described processes. Thus far, the method of manufacturing the light-emitting device 10b in which the first light-emitting region 110a defined by partition walls WS includes one light-emitting cell 220 has been described.

A method of manufacturing a light-emitting device in which the first light-emitting region 110a defined by the partition walls WS includes at least two light-emitting cells 220 may be easily understood by one skilled in the art based on the above-described manufacturing method. That is, after at least two light-emitting cells 220 to be included in a first light-emitting region 110a are formed, the partition walls WS may be formed to surround the at least two light-emitting cells 220, and the substrate 210 may be partially removed such that there is no partition wall between the at least two light-emitting cells 220.

Figure 13A:
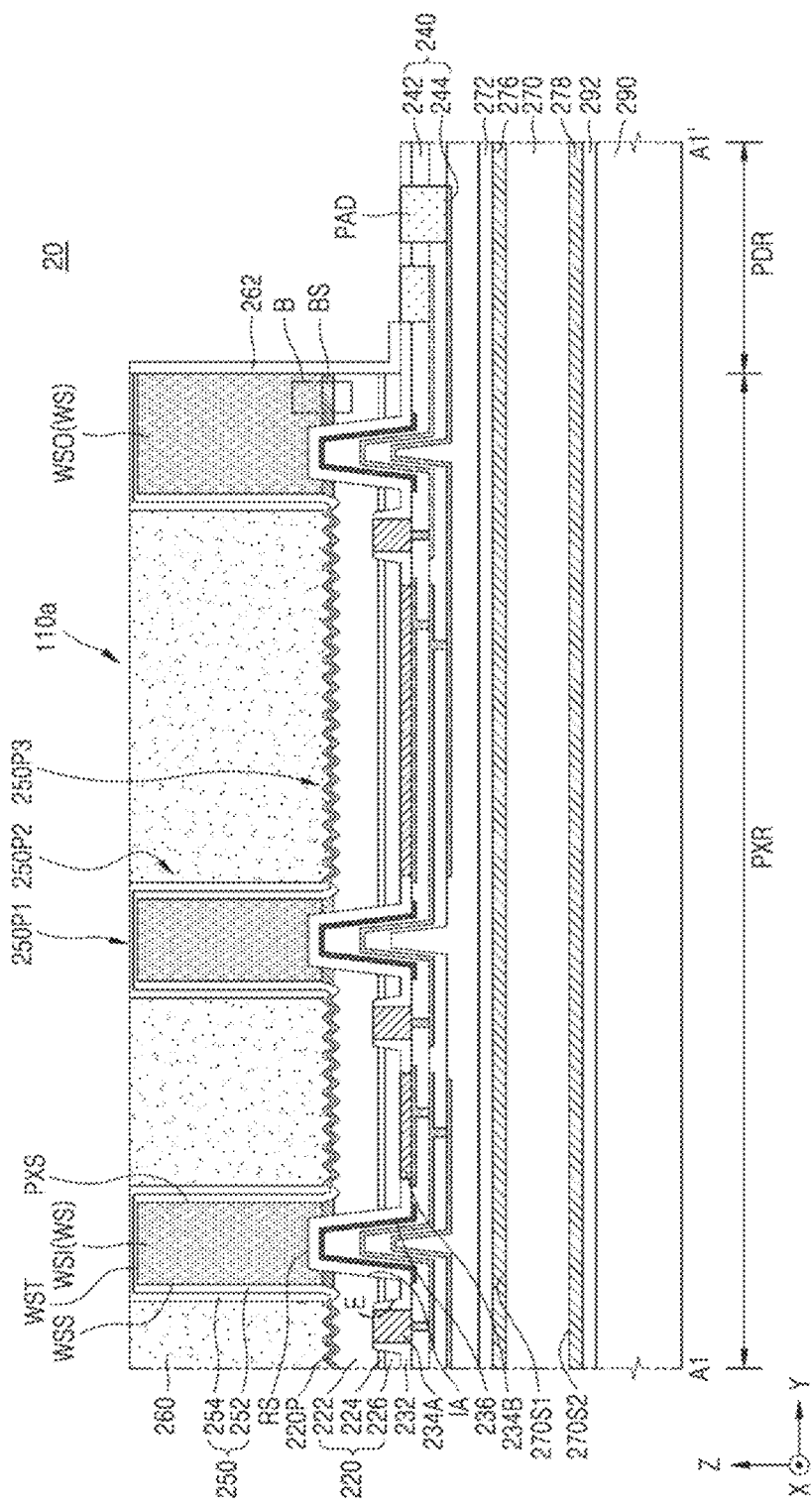
FIG. 13A is a side view of a light-emitting module according to an example embodiment.

FIG. 13A is a lateral view of a light-emitting module 20 according to an example embodiment.

The light-emitting module 20 shown in FIG. 13A may be substantially the same as the light-emitting device 10b shown in FIG. 11 except that a printed circuit board (PCB) 290 is further provided. Accordingly, differences between the light-emitting module 20 shown in FIG. 13A and the light-emitting device 10b shown in FIG. 11 will mainly be described below.

The PCB 290 may be combined with a support substrate 270 by an adhesive layer 292. The PCB 290 may overlap a plurality of light-emitting cells 220 in a vertical direction (e.g., the z direction of FIG. 13A) with a wiring structure 240 and a support substrate 270 therebetween.

The PCB 290 may use a typical circuit board for packages without limitation. In example embodiments, a chip including a light source, a backlight driver circuit, a camera driver circuit, or a power driver circuit may be mounted on the PCB 290. The PCB 290 may be electrically connected to the plurality of light-emitting cells 220 through a plurality of pads PAD. In example embodiments, the PCB 290 may supply power to the plurality of light-emitting cells 220. In example embodiments, a circuit pattern or terminal may be formed on at least one surface of the PCB 290. The plurality of pads PAD may be electrically connected to terminals formed on the PCB 290 through bonding wires.

The adhesive layer 292 may include an insulating material, for example, silicon oxide, silicon nitride, a polymer material such as an ultraviolet (UV)-curable material, or resin. In some embodiments, the adhesive layer 292 may include a eutectic adhesive material, such as AuSn, NiSn, AuSi, CuSn, AgSn, PtSn, NiSnAu, and PtSnAu, solder paste, or an epoxy resin including metal powder.

In some embodiments, the light-emitting module 20 may further include a buffer structure BS provided between partition walls WS and a first conductive semiconductor layer 222.

Figure 13B:
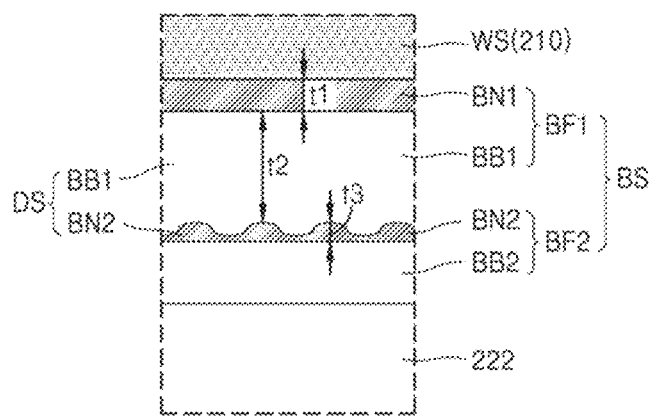
FIG. 13B is an enlarged view of portion B of FIG. 13A.

FIG. 13B is an enlarged view of portion B of FIG. 13A.

Referring to FIG. 13B, the buffer structure BS may include a first buffer layer BF1 and a second buffer layer BF2. A thickness of the first buffer layer BF1 may be greater than a thickness of the second buffer layer BF2.

The first buffer layer BF1 may include a nucleation layer BN1 and a first material layer BB1. The nucleation layer BN1 may be a layer for forming nuclei for crystal growth and include, for example, aluminum nitride (A1N). The first material layer BB1 may include $B_xAl_yIn_zGa_{1-x-y-z}N$ ($0 \leq x<1$, $0<y<1$, $0 \leq z<1$, $0 \leq x+y+z<1$).

The second buffer layer BF2 may include a bending layer BN2 and a second material layer BB2. The bending layer BN2 may have a different lattice constant from the first material layer BB1. In some embodiments, the bending layer BN2 may include the same material as the nucleation layer BN1. For example, the bending layer BN2 may include aluminum nitride (AlN). A difference in lattice constant between the first material layer BB1 and the bending layer BN2 may bend a dislocation or form a dislocation half-loop and reduce the dislocation at an interface between the first material layer BB1 and the bending layer BN2 (i.e., a bottom surface of the first material layer BB1 as shown in FIG. 13B).

Furthermore, a roughness of a bottom surface of the first material layer BB1 may be higher than a roughness of a bottom surface of the nucleation layer BN1 and a roughness of a bottom surface of the bending layer BN2. The bottom surface of the first material layer BB1 may have a roughness of about 10 nm to about 500 nm.

In some embodiments, the lattice constant of the bending layer BN2 may be lower than the lattice constant of the first material layer BB1. Accordingly, tensile stress may be caused in the bending layer BN2 and result in cracks. In this case, the bending layer BN2 may be formed to a thickness t3 less than a thickness t1 of the nucleation layer BN1, and thus, tensile stress may be reduced to prevent the occurrence of cracks. As used herein, a thickness of a layer may be defined as a maximum thickness of the layer.

The second material layer BB2 may reduce differences in lattice constant and coefficient of thermal expansion (CTE) between a layer (e.g., the first conductive semiconductor layer 222) formed on the buffer structure BS and the bending layer BN2. For example, a lattice constant of the second material layer BB2 may be between a lattice constant of the first conductive semiconductor layer 222 and a lattice constant of the bending layer BN2. In addition, a CTE of the second material layer BB2 may be between a CTE of the first conductive semiconductor layer 222 and a CTE of the bending layer BN2. In some embodiments, the second material layer BB2 may include the same material as the first material layer BB1. In some embodiments, the second material layer BB2 may include $B_xAl_yIn_zGa_{1-x-y-z}N$ ($0 \leq x<1$, $0<y<1$, $0 \leq z<1$, $0 \leq x+y+z<1$).

Figure 14:
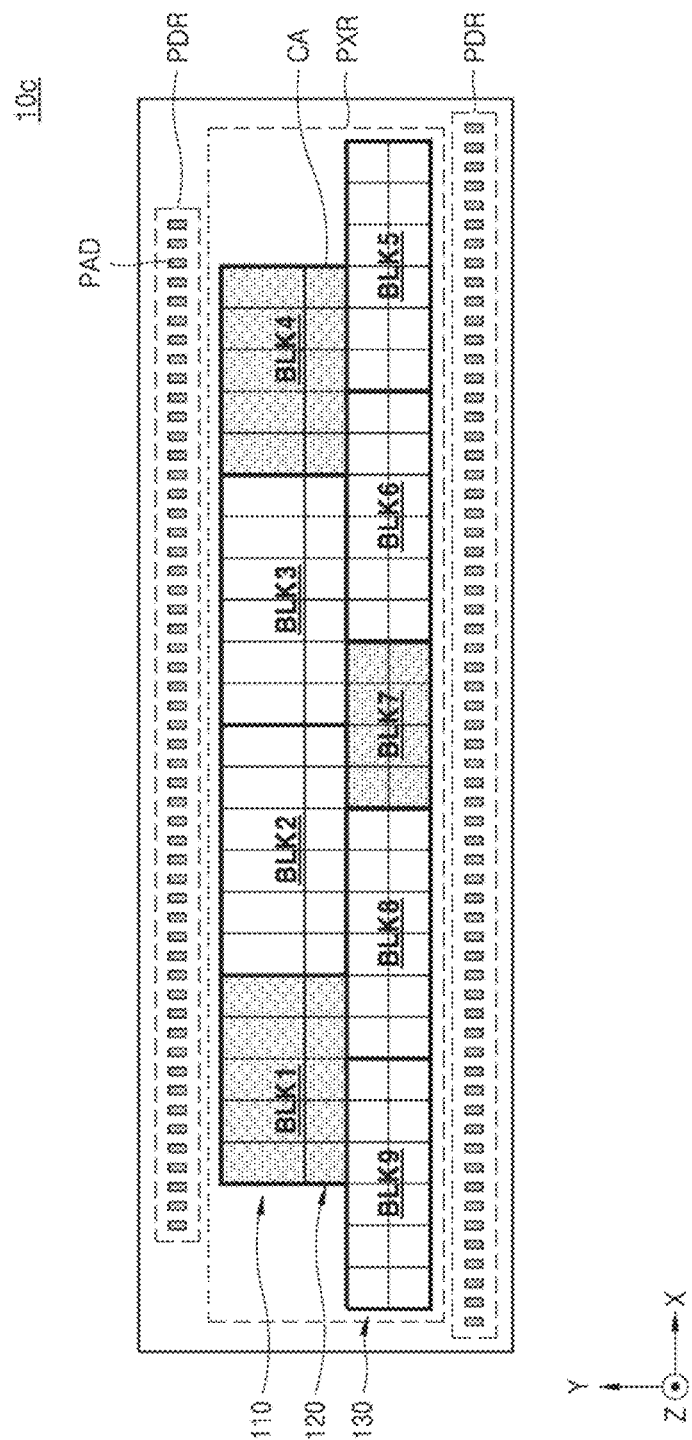
FIG. 14 is a plan view of a light-emitting device according to an example embodiment.

FIG. 14 is a plan view of a light-emitting device 10c according to an example embodiment.

Referring to FIG. 14, the light-emitting device 10c may include a plurality of cell blocks (e.g., BLK1 to BLK9). Each of the plurality of cell blocks BLK1 to BLK9 may constitute one sub-array and include a plurality of light-emitting cells arranged in a matrix form. Although FIG. 14 illustrates nine cell blocks BLK1 to BLK9, the light-emitting device 10c according to the present example embodiment is not limited thereto. The number of cell blocks BLK1 to BLK9 may vary, and the arrangement of cell blocks BLK1 to BLK9 may also vary. The number of light-emitting cells included in each of the plurality of cell blocks (or sub-arrays) may be variously provided in the light-emitting device 10c, and thus, the light-emitting cells may be arranged to correspond to a light distribution type of a product provided with the light-emitting device 10c. In an example embodiment, the light-emitting device 10c may include a specific cell block (e.g., BLK7), which is positioned in the center of a cell array region and includes a smaller number of light-emitting cells than other cell blocks (e.g., BLK 2, BLK 3, BLK 5, BLK 6, BLK 8, and BLK 9). The light-emitting device 10c may need to irradiate light having a relatively high light intensity to a central area in front of a user in a direction in which the user travels. Accordingly, it may be required to supply a relatively large current to the specific cell block (e.g., BLK7) positioned in the center of the cell array region as shown in FIG. 14. Because the specific cell block (e.g., BLK7) positioned in the center of the cell array region includes a relatively small number of light-emitting cells, even when the relatively large current is supplied to the specific cell block, the total power consumption caused by the specific cell block may be reduced.

Alternatively, in an example embodiment, the light-emitting device 10c may include specific cell blocks (e.g., BLK1 and BLK4), which are positioned at upper outer portions of the cell array region and include a smaller number of light-emitting cells than other cell blocks (e.g., BLK 2, BLK 3, BLK 5, BLK 6, BLK 8, and BLK 9). The light-emitting device 10c may have a low need to irradiate light to upper outer areas in front of a user in a direction in which the user travels. Because the specific cell blocks (e.g., BLK1 and BLK4) positioned at the upper outer portions of the light-emitting device 10c include the smaller number of light-emitting cells than the other cell blocks, the light-emitting device 10c may not irradiate an unnecessary amount of light to unnecessary areas.

Figure 15:
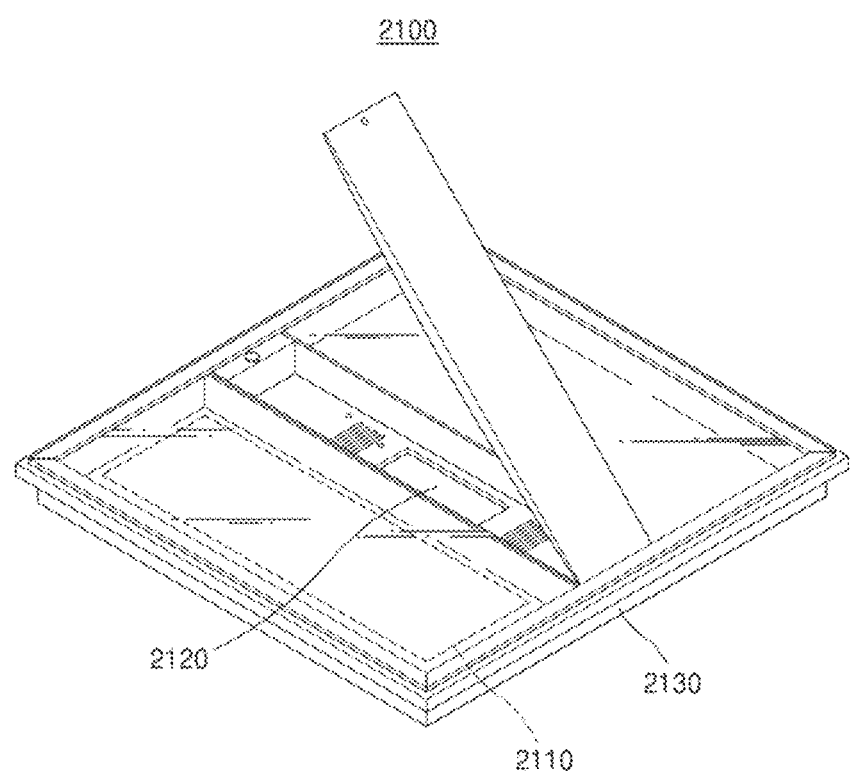
FIG. 15 is a schematic perspective view of a flat-panel lighting apparatus including a light-emitting device or a light-emitting module, according to an example embodiment.

FIG. 15 is a schematic perspective view of a flat-panel lighting apparatus 2100 including at least one of the light-emitting devices 10, 10a, and 10b and the light-emitting module 20, according to example embodiments.

Referring to FIG. 15, the flat-panel lighting apparatus 2100 may include a light source module 2110, a power supply 2120, and a housing 2130.

The light source module 2110 may include at least one of the light-emitting devices 10, 10a, and 10b and the light-emitting module 20 described above. The light source module 2110 may have a flat shape as a whole.

The power supply 2120 may be configured to supply power to the light source module 2110. The housing 2130 may form an accommodation space for accommodating the light source module 2110 and the power supply 2120. The housing 2130 may be formed to have a hexahedral shape with one opened side, but is not limited thereto. The light source module 2110 may be positioned to emit light toward the opened side of the housing 2130.

Figure 16:
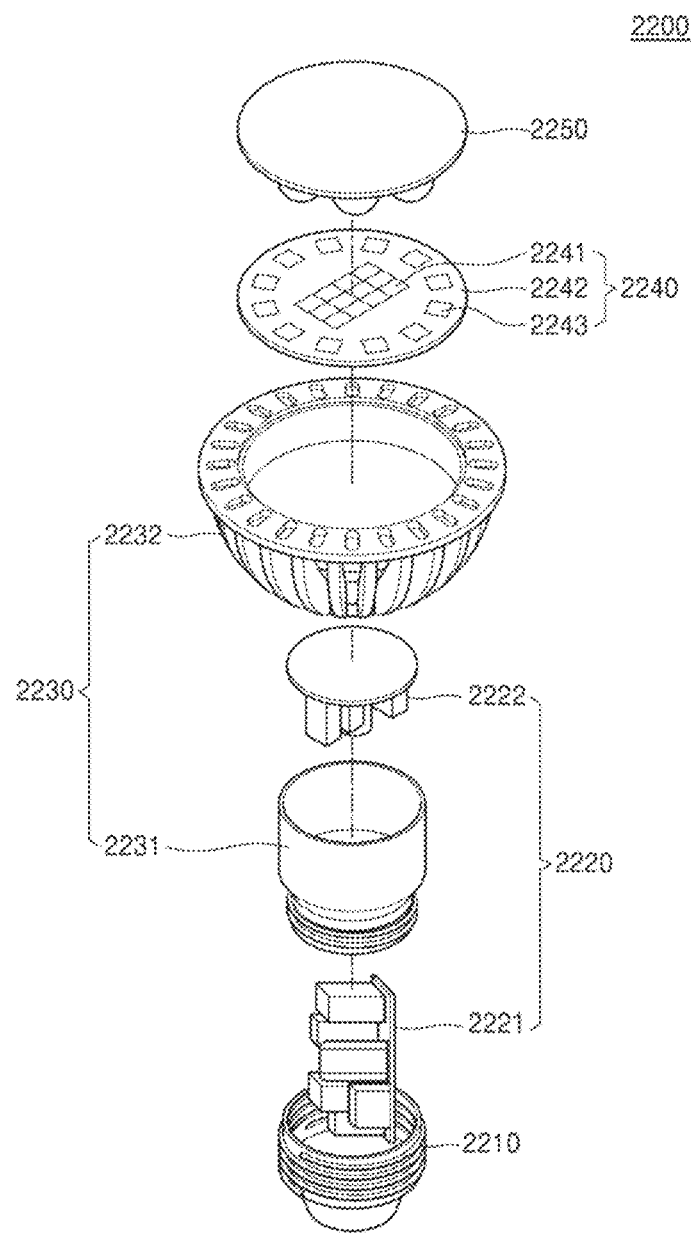
FIG. 16 is an exploded perspective view of a lighting apparatus including a light-emitting device or a light-emitting module, according to an example embodiment.

FIG. 16 is an exploded perspective view of a lighting apparatus 2200 including at least one of the light-emitting devices 10, 10a, and 10b and the light-emitting module 20, according to example embodiments.

Referring to FIG. 16, the lighting apparatus 2200 may include a socket 2210, a power supply 2220, a heat sink 2230, a light source module 2240, and an optical unit 2250.

The socket 2210 may be configured to be replaceable with an existing lighting apparatus. Power may be supplied to the lighting apparatus 2200 through the socket 2210. The power supply 2220 may be dissembled into a first power supply 2221 and a second power supply 2222. The heat sink 2230 may include an internal heat sink 2231 and an external heat sink 2232. The internal heat sink 2231 may be directly connected to the light source module 2240 and/or the power supply 2220 and transmit heat to the external heat sink 2232. The optical unit 2250 may include an internal optical unit and an external optical unit. The optical unit 2250 may be configured to uniformly disperse light emitted by the light source module 2240.

The light source module 2240 may receive power from the power supply 2220 and emit light to the optical unit 2250. The light source module 2240 may include at least one light-emitting element package 2241, a circuit board 2242, and a controller 2243. The controller 2243 may store driving information of the light-emitting element packages 2241. The light source module 2240 may include at least one of the light-emitting devices 10, 10a, and 10b and the light-emitting module 20 according to example embodiments.

Figure 17:
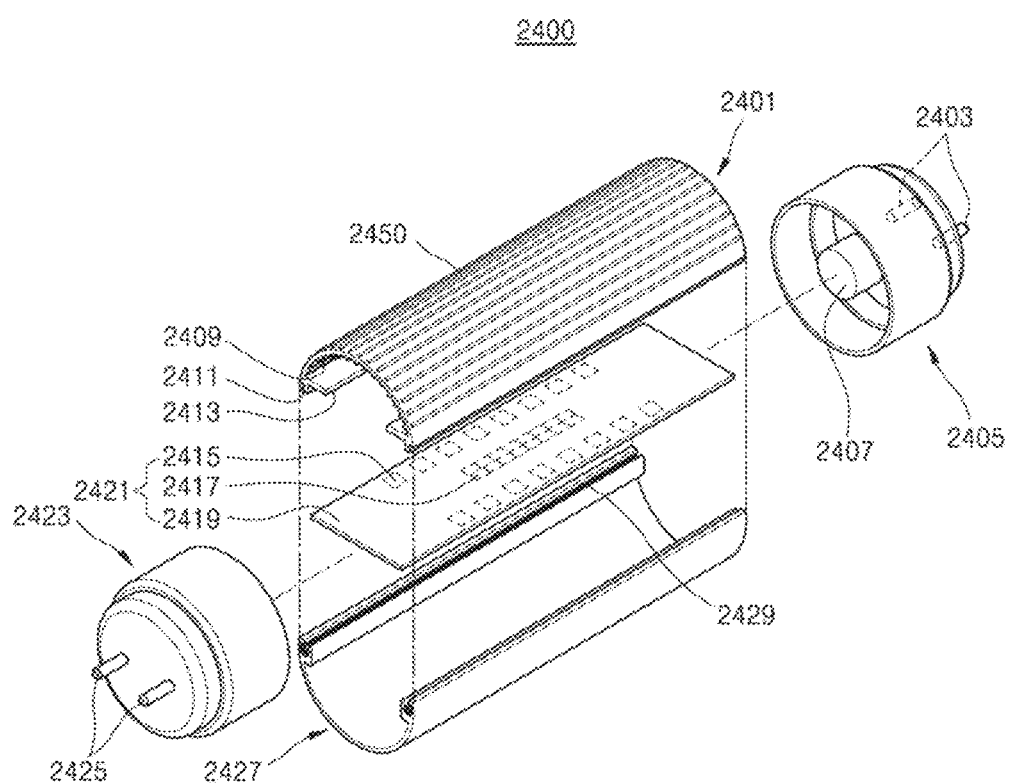
FIG. 17 is an exploded perspective view of a bar-type lighting apparatus including a light-emitting device or a light-emitting module, according to an example embodiment.

FIG. 17 is an exploded perspective view of a bar-type lighting apparatus 2400 including at least one of the light-emitting devices 10, 10a, and 10b, and the light-emitting module 20, according to example embodiments.

Referring to FIG. 17, the bar-type lighting apparatus 2400 may include a heat sink member 2401, a cover 2427, a light source module 2421, a first socket 2405, and a second socket 2423. A plurality of heat sink fins 2450 and 2409 having a concave/convex shape may be formed on inner or/and outer surfaces of the heat sink member 2401. The heat sink fins 2450 and 2409 may be designed to have various shapes and intervals. A support 2413 having a protruding shape may be formed inside the heat sink member 2401. The light source module 2421 may be fixed to the support 2413. Locking protrusions 2411 may be formed on both ends of the heat sink member 2401.

Locking grooves 2429 may be formed in the cover 2427. The locking protrusions 2411 of the heat sink member 2401 may be hooked to the locking grooves 2429. Positions of the locking grooves 2429 may be exchanged with positions of the locking protrusions 2411.

The light source module 2421 may include a printed circuit board (PCB) 2419, a light source 2417, and a controller 2415. The controller 2415 may store driving information of the light source 2417. Circuit wirings may be formed on the PCB 2419 so as to operate the light source 2417. In addition, the light source module 2421 may include components for operating the light source 2417.

The light source module 2421 may include at least one of the light-emitting devices 10, 10a, and 10b and the light-emitting module 20 according to the example embodiments.

The first and second sockets 2405 and 2423 may be provided as a pair of sockets and may be connected to both ends of a cylindrical cover unit including the heat sink member 2401 and the cover 2427. For example, the first socket 2405 may include an electrode terminal 2403 and a power supply 2407, and the second socket 2423 may include a dummy terminal 2425. In addition, an optical sensor and/or a communication module may be embedded into any one of the first socket 2405 and the second socket 2423.

Figure 18:
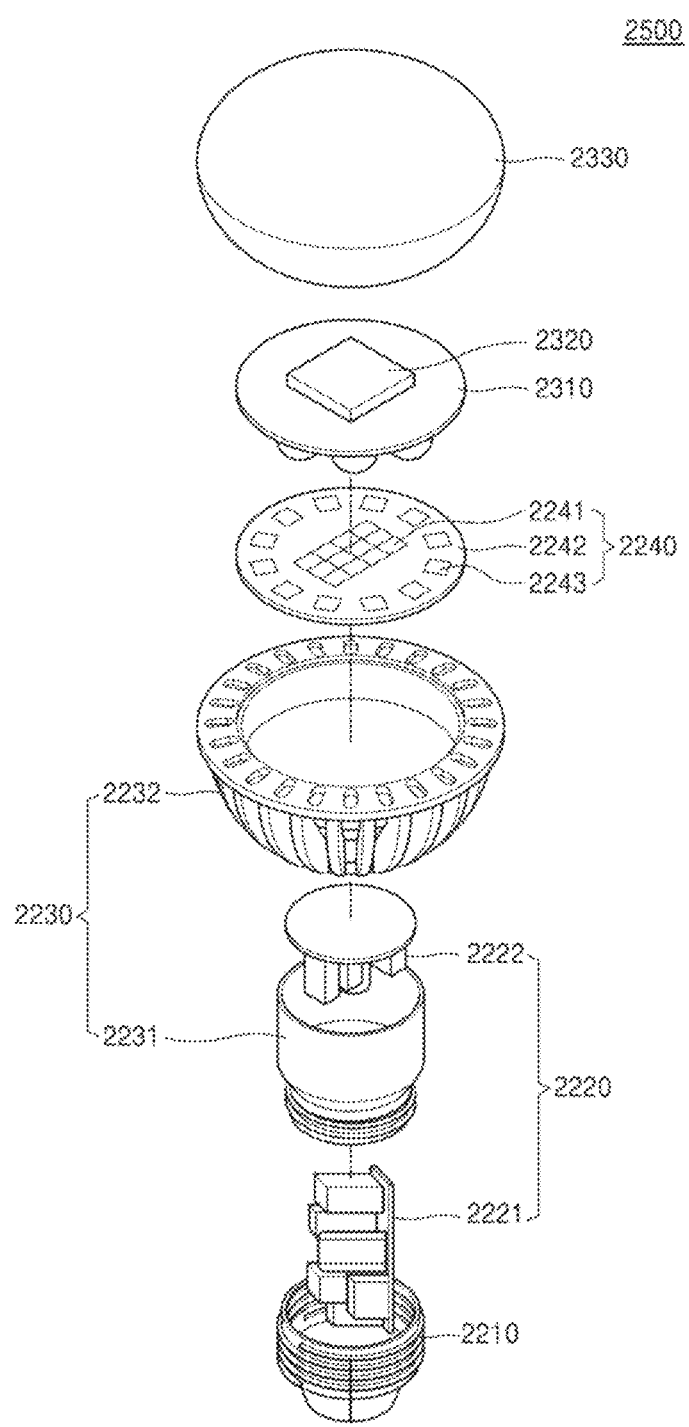
FIG. 18 is an exploded perspective view of a lighting apparatus including a light-emitting device or a light-emitting module, according to an embodiment.

FIG. 18 is an exploded perspective view of a lighting apparatus 2500 including at least one of the light-emitting devices 10, 10a, and 10b and the light-emitting module 20, according to example embodiments.

The lighting apparatus 2500 of FIG. 18 is generally similar to the lighting apparatus 2200 of FIG. 16 except that a reflection plate 2310 and a communication module 2320 are provided on a light source module 2240. The reflection plate 2310 may uniformly disperse light from a light source in a lateral direction and a rearward direction so as to reduce glare. The communication module 2320 may be mounted on the reflection plate 2310. Home network communication may be implemented through the communication module 2320. For example, the communication module 2320 may be a wireless communication module using ZigBee, WiFi, or LiFi, and may control an indoor or outdoor lighting apparatus, such as on/off operations or brightness adjustment of the lighting apparatus 2500 through a smartphone or a wireless controller. Also, the communication module 2320 may control indoor or outdoor electronic appliances and vehicle systems, such as TVs, refrigerators, air conditioners, doorlock systems, and vehicles. The reflection plate 2310 and the communication module 2320 may be covered by a cover 2330.

The light source module 2240 and/or the communication module 2320 may include at least one of the light-emitting devices 10, 10a, and 10b and the light-emitting module 20 according to the example embodiments.

Figure 19:
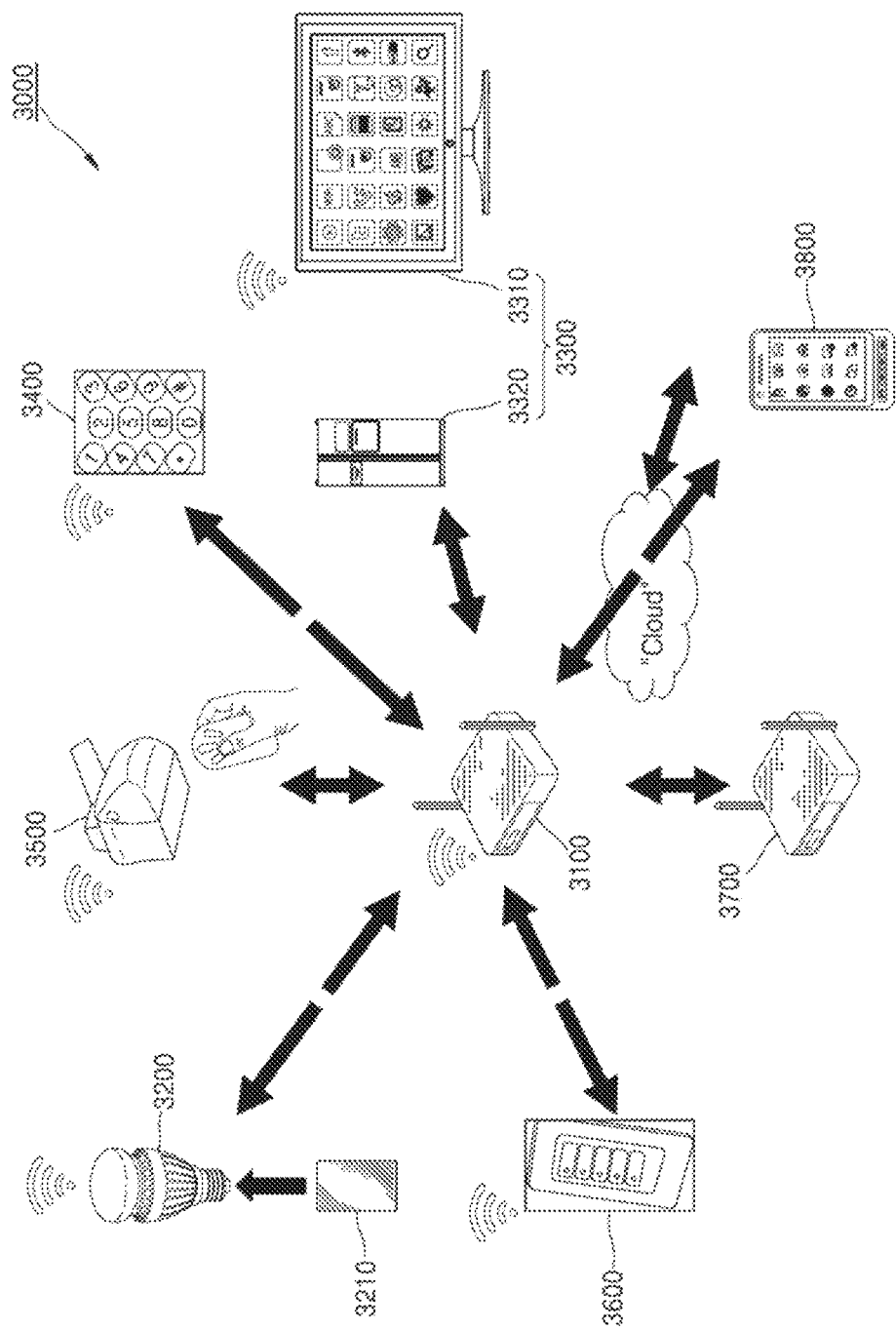
FIG. 19 is a schematic diagram for describing an indoor lighting control network system including a light-emitting device or a light-emitting module, according to an example embodiment.

FIG. 19 is a schematic diagram for describing an indoor lighting control network system 3000 including at least one of the light-emitting devices 10, 10a, and 10b, and the light-emitting module 20, according to example embodiments.

The indoor lighting control network system (hereinafter, referred to as network system) 3000 may be a composite smart lighting-network system in which are converged illumination technology using a light-emitting element, such as a light-emitting diode (LED), Internet of Things (IoT) technology, and wireless communication technology. The network system 3000 may be implemented using various lighting apparatuses and wired/wireless communication devices. Alternatively, the network system 3000 may be implemented based on an IoT environment so as to collect and process a variety of information and provide the information to users.

An LED lamp 3200 included in the network system 3000 may receive information about an ambient environment from a gateway 3100 and control illumination of the LED lamp 3200 itself. Furthermore, the LED lamp 3200 may check and control the operation states of other devices (e.g., 3300 to 3800) included in the IoT environment based on a visible light communication function of the LED lamp 3200.

The LED lamp 3200 may include at least one of the light-emitting devices 10, 10a, and 10b and the light-emitting module 20 according to example embodiments. The LED lamp 3200 may be communicably connected to the gateway 3100 by the wireless communication protocol such as WiFi, ZigBee, or LiFi. To this end, the LED lamp 3200 may include at least one lamp communication module 3210.

In a case where the network system 3000 is applied to the home, the plurality of devices (e.g., 3300 to 3800) may include electronic appliances 3300, a digital doorlock 3400, a garage doorlock 3500, a lighting switch 3600 installed on a wall, a router 3700 for relaying a wireless communication network, and mobile devices 3800 such as smartphones, tablets, or laptop computers.

In the network system 3000, the LED lamp 3200 may check operation states of the various devices (e.g., 3300 to 3800) or automatically control the illumination of the LED lamp 3200 itself according to the ambient environment and conditions by using the wireless communication network (e.g., ZigBee, WiFi, LiFi, etc.) installed at the home. In addition, the LED lamp 3200 may control the devices (e.g., 3300 to 3800) included in the network system 3000 through LiFi communication using visible light emitted by the LED lamp 3200.

The LED lamp 3200 may automatically control the illumination of the LED lamp 3200 based on the information about the ambient environment, which is transmitted from the gateway 3100 through the lamp communication module 3210, or the information about the ambient environment, which is collected from a sensor mounted on the LED lamp 3200. For example, the brightness of the LED lamp 3200 may be automatically adjusted according to a kind of a TV program aired on the TV 3310 or a screen brightness of the TV 3310. To this end, the LED lamp 3200 may receive operation information of the TV 3310 from the lamp communication module 3210 connected to the gateway 3100. The lamp communication module 3210 may be integrally modularized with a sensor and/or a controller included in the LED lamp 3200.

For example, after elapse of a predetermined time after the digital doorlock 3400 has been locked in such a state that there is no person at home, it is possible to prevent waste of electricity by turning off the turned-on LED lamp 3200. Alternatively, in a case where a security mode is set through the mobile device 3800 or the like, when the digital doorlock 3400 is locked in such a state that there is no person at home, the LED lamp 3200 may be maintained in the turned-on state.

The operation of the LED lamp 3200 may be controlled according to information about the ambient environment, which is collected through various sensors connected to the network system 3000. For example, in a case where the network system 3000 is implemented in a building, it is possible to turn on or off the illumination by combining a lighting apparatus, a position sensor, and a communication module within the building, or provide collected information in real time, thus enabling efficient facility management or efficient utilization of unused space.

Figure 20:
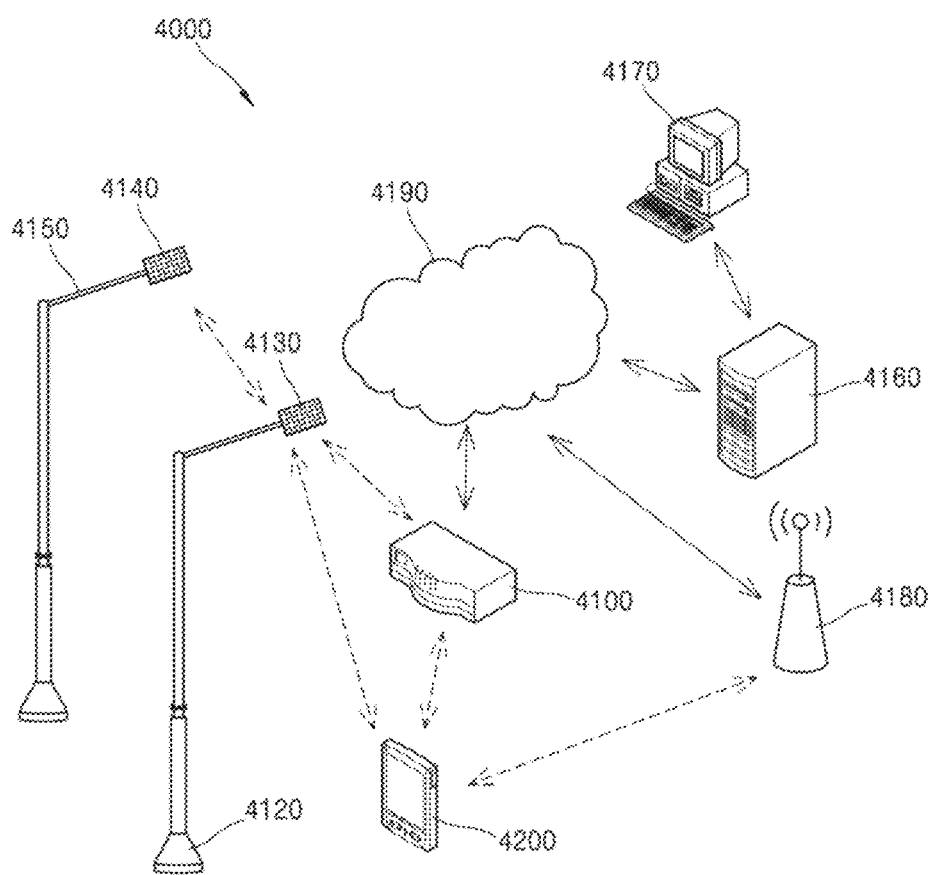
FIG. 20 is a schematic diagram of a network system including a light-emitting device or a light-emitting module, according to an example embodiment.

FIG. 20 is a schematic diagram for describing a network system 4000 including at least one of the light-emitting devices 10, 10a, and 10b and the light-emitting module 20, according to example embodiments. FIG. 20 illustrates a schematic configuration of the network system 4000 applied to an open space, according to an example embodiment.

The network system 4000 may include a communication connecting device 4100, a plurality of lighting apparatuses (e.g., 4120 and 4150) installed at predetermined intervals and communicably connected to the communication connecting device 4100, a server 4160, a computer 4170 configured to manage the server 4160, a communication base station 4180, a communication network 4190 configured to connect communicable devices, and a mobile device 4200.

The plurality of lighting apparatuses 4120 and 4150 installed in open external spaces such as streets or parks may include smart engines 4130 and 4140, respectively. Each of the smart engines 4130 and 4140 may include a light-emitting element configured to emit light, a driver configured to drive the respective light-emitting element, a sensor configured to collect information about an ambient environment, and a communication module.

The smart engines 4130 and 4140 may include at least one of the light-emitting devices 10, 10a, and 10b and the light-emitting module 20 according to example embodiments.

The communication module may enable the smart engines 4130 and 4140 to communicate with other peripheral devices in accordance with a communication protocol such as WiFi, ZigBee, or LiFi. One smart engine 4130 may be communicably connected to the other smart engine 4140. In this case, a WiFi mesh may be applied to the communication between the smart engines 4130 and 4140. At least one smart engine 4130 may be connected to the communication connecting device 4100 connected to the communication network 4190 by a wired/wireless communication.

The communication connecting device 4100 may be an access point (AP) capable of performing wired/wireless communications and may relay a communication between the communication network 4190 and other devices. The communication connecting device 4100 may be connected to the communication network 4190 by at least one of the wired/wireless communication schemes. For example, the communication connecting device 4100 may be mechanically accommodated in one of the lighting apparatuses 4120 and 4150.

The communication connecting device 4100 may be connected to the mobile device 4200 through a communication protocol such as WiFi. A user of the mobile device 4200 may receive information about the ambient environment, which is collected by a plurality of smart engines (e.g., 4130 and 4140), through the communication connecting device 4100 connected to the smart engine 4130 of an adjacent lighting apparatus 4120. The information about the ambient environment may include neighboring traffic information, weather information, and the like. The mobile device 4200 may be connected to the communication network 4190 through the communication base station 4180 by a wireless cellular communication scheme such as a 3G or 4G communication scheme.

The server 4160 connected to the communication network 4190 may receive information collected by the smart engines 4130 and 4140 respectively mounted on the lighting apparatuses 4120 and 4150 by way of the communication network 4190 and may monitor the operation states of the lighting apparatuses 4120 and 4150. The server 4160 may be connected to the computer 4170 that provides a management system, and the computer 4170 may execute software capable of monitoring and managing the operation states of the smart engines 4130 and 4140.

Figure 21:
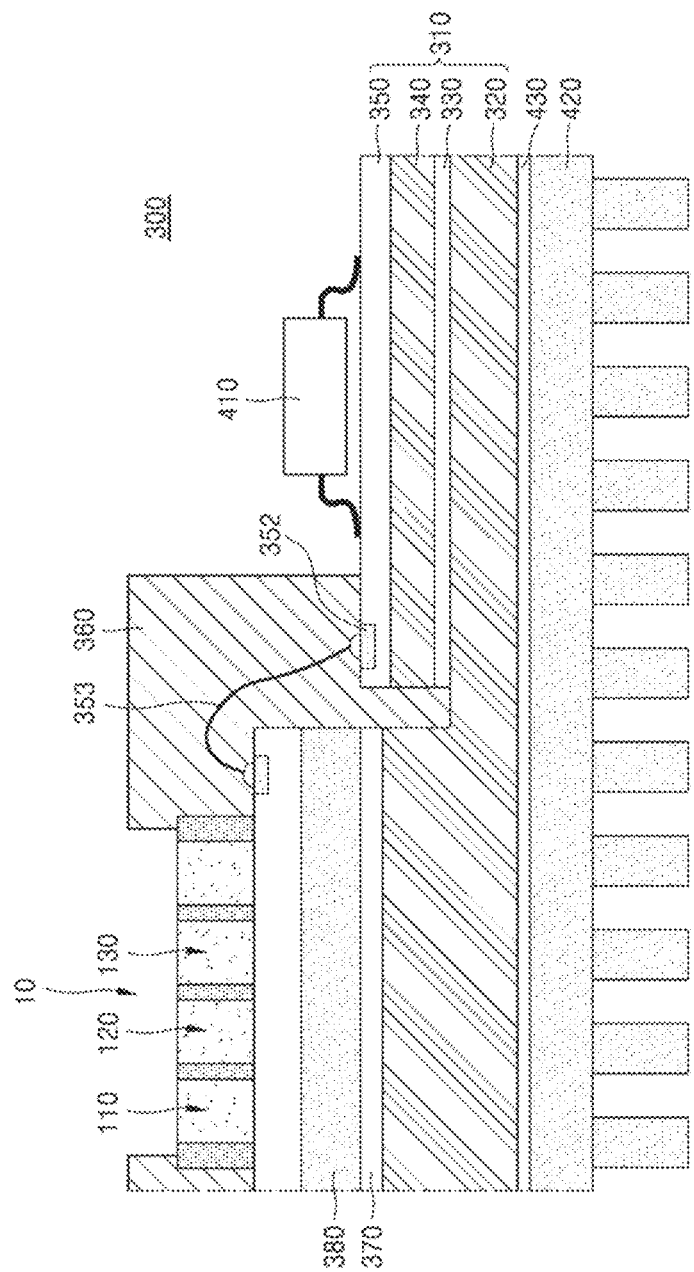
FIG. 21 is a cross-sectional view of a light-emitting package including a light-emitting device, according to an example embodiment.

FIG. 21 is a cross-sectional view of a light-emitting package 300 including a light-emitting device 10 according to example embodiments. In FIG. 21, the same reference numerals are used to denote the same elements as in FIGS. 1 to 20.

Referring to FIG. 21, the light-emitting package 300 may include the light-emitting device 10 and a driver semiconductor chip 410, which are mounted on a package substrate 310.

A lower insulating layer 330, an inner conductive pattern layer 340, and an upper insulating layer 350 may be sequentially stacked on a partial region of a base plate 320, and at least one driver semiconductor chip 410 may be mounted on a conductive pattern positioned on the upper insulating layer 350.

An interposer 380 may be positioned on another region of the base plate 320 with an adhesive layer 370 therebetween, and the light-emitting device 10 may be mounted on the interposer 380. In example embodiments, the interposer 380 may be the support substrate (refer to 270 in FIG. 11) included in the light-emitting device 10, but is not limited thereto. The at least one driver semiconductor chip 410 may be electrically connected to the light-emitting device 10 through a bonding wire 353 connected to a pad 352. The at least one driver semiconductor chip 410 may individually or wholly drive a plurality of light-emitting regions 110, 120, and 130 of the light-emitting device 10.

The bonding wire 353 may be encapsulated by a molding resin 360. The molding resin 360 may include, for example, an epoxy molding compound (EMC), but is not specifically limited. The molding resin 360 may partially encapsulate the light-emitting device 10 so as not to interfere with light emitted by the plurality of light-emitting regions 110, 120, 130 of the light-emitting device 10.

A heat sink 420 may be adhered onto a bottom surface of the base plate 320, and a thermal interface material (TIM) layer 430 may be selectively further interposed between the heat sink 420 and base plate 320.

The light-emitting devices 10, 10*a*, 10*b*, and 10*c* and the light-emitting module 20, which are described above with reference to FIGS. 1 to 20, may be mounted alone or in a combination thereof in the light-emitting package 300.

While the example embodiments have been particularly shown and described, it will be understood that various changes in form and details may be made therein without departing from the spirit and scope of the following claims.

What is claimed is:
1. A light-emitting device comprising:
    a plurality of first light-emitting regions contiguously arranged in a horizontal direction, wherein each first light-emitting region comprises at least one light-emitting cell;
    a plurality of second light-emitting regions contiguously arranged in the horizontal direction, wherein each second light-emitting region comprises at least one light-emitting cell, and the plurality of second light-emitting regions are adjacent to the plurality of first light-emitting regions in a vertical direction that intersects the horizontal direction; and
    a first driver controller configured to control emission of the plurality of first light-emitting regions,
    wherein each first light-emitting region of the plurality of first light-emitting regions has a dimension greater than a dimension of each second light-emitting region of the plurality of second light-emitting regions in the vertical direction,
    wherein the first driver controller is further configured to simultaneously turn on or off an entirety of each first light-emitting region of the plurality of first light-emitting regions, and
    wherein the first driver controller is further configured to, in response to an input signal indicating an object approaching from a front of the light-emitting device, turn off at least one first light-emitting region of the plurality of first light-emitting regions and turn on at least one second light-emitting region of the plurality of second light-emitting regions positioned under the at least one first light-emitting region in the vertical direction.

2. The light-emitting device of claim 1, wherein each first light-emitting region of the plurality of first light-emitting regions further comprises a partition wall defining the first light-emitting region.

3. The light-emitting device of claim 2, wherein each first light-emitting region of the plurality of first light-emitting regions has a dimension of A in the horizontal direction and a dimension of B in the vertical direction, and a ratio of A to B is about 1:1.5 to about 1:4.5.

4. The light-emitting device of claim 2, wherein each first light-emitting region of the plurality of first light-emitting regions comprises only one light-emitting cell.

5. The light-emitting device of claim 2, wherein at least one first light-emitting region of the plurality of first light-emitting regions comprises a plurality of light-emitting cells.

6. The light-emitting device of claim 5, wherein the first driver controller is further configured to simultaneously turn on or off the plurality of light-emitting cells of the at least one first light-emitting region.

7. The light-emitting device of claim 1, wherein the first driver controller is further configured to independently controls on and off operations of each first light-emitting region of the plurality of first light-emitting regions.

8. A headlamp for a vehicle, the headlamp comprising:
    a light-emitting device comprising:
        a plurality of first light-emitting regions contiguously arranged in a horizontal direction, wherein each first light-emitting region of the plurality of first light-emitting regions comprises at least one light-emitting cell, and each first light-emitting region of the plurality of first light-emitting regions has a dimension of A in the horizontal direction and has a dimension of B in a vertical direction that intersects the horizontal direction and is greater than A;
        a plurality of second light-emitting regions contiguously arranged in the horizontal direction, wherein each second light-emitting region of the plurality of second light-emitting regions comprises at least one light-emitting cell, and the plurality of second light-emitting regions are adjacent to the plurality of first light-emitting regions in the vertical direction; and a first driver controller configured to control emission of the plurality of first light-emitting regions, wherein the first driver controller is further configured to independently control on and off operations of each first light-emitting region of the plurality of first light-emitting regions, wherein the first driver controller is further configured to turn on or off an entirety of each first light-emitting region of the plurality of first light-emitting regions, and wherein the first driver controller is further configured to, in response to an input signal indicating an object approaching from a front of the headlamp, turn off at least one first light-emitting region of the plurality of first light-emitting regions and turn on at least one second light-emitting region of the plurality of second light-emitting regions positioned under the at least one first light-emitting region in the vertical direction.

9. The headlamp of claim 8, wherein the first driver controller is further configured to, in response to an input signal indicating an object approaching from a front of the headlamp, turn off at least one first light-emitting region of the plurality of first light-emitting regions and turn on remaining first light-emitting regions of the plurality of first light-emitting regions.

10. The headlamp of claim 9, wherein each first light-emitting region of the plurality of first light-emitting regions further comprises a partition wall defining the first light-emitting region.

11. The headlamp of claim 10, wherein each first light-emitting region of the plurality of first light-emitting regions comprises only one light-emitting cell.

12. The headlamp of claim 10, wherein a ratio of A to B is about 1:1.5 to 1:4.5.

13. The headlamp of claim 9, wherein each second light-emitting region of the plurality of second light-emitting regions further comprises a partition wall defining the first light-emitting region, and wherein a dimension of each second light-emitting region of the plurality of second light-emitting regions in the vertical direction is less than the dimension of each first light-emitting region of the plurality of first light-emitting regions in the vertical direction.

14. The headlamp of claim 9, further comprising a plurality of third light-emitting regions contiguously arranged in the horizontal direction, wherein each third light-emitting region of the plurality of third light-emitting regions comprises at least one light-emitting cell, and the plurality of third light-emitting regions are adjacent to the plurality of second light-emitting regions in the vertical direction.

15. The headlamp of claim 14, wherein each third light-emitting region of the plurality of third light-emitting regions further comprises a partition wall defining the third light-emitting region, and wherein a dimension of each third light-emitting region of the plurality of third light-emitting regions in the vertical direction is less than the dimension of each first light-emitting region of the plurality of first light-emitting regions in the vertical direction and is substantially equal to a dimension of each of the plurality of second light-emitting regions in the vertical direction.

16. The headlamp of claim 14, wherein, in response to the input signal indicating an object approaching from the front of the headlamp, at least one second light-emitting region of the plurality of second light-emitting regions and at least one third light-emitting region of the plurality of third light-emitting regions are turned off, and remaining second light-emitting regions of the plurality of second light-emitting regions and remaining third light-emitting regions of the plurality of third light-emitting regions are turned on.

17. The headlamp of claim 8, further comprising a printed circuit board (PCB), wherein the light-emitting device is mounted on the PCB.

18. A headlamp for a vehicle, the headlamp comprising:
a light-emitting device comprising:
a plurality of first light-emitting regions contiguously arranged in a horizontal direction, wherein each first light-emitting region of the plurality of first light-emitting regions comprises at least one light-emitting cell;

a plurality of second light-emitting regions contiguously arranged in the horizontal direction, wherein each first light-emitting region of the plurality of second light-emitting regions comprises at least one light-emitting cell and the plurality of second light-emitting regions are adjacent to the plurality of first light-emitting regions in a vertical direction that intersects the horizontal direction; and a first driver controller configured to control emission of the plurality of first light-emitting regions, wherein each first light-emitting region of the plurality of first light-emitting regions has a dimension of A in the horizontal direction and a dimension of B in the vertical direction, and a ratio of A to B is about 1:1.5 to about 1:4.5, and wherein the first driver controller is further configured to, in response to an input signal indicating an object approaching from a front of the headlamp, turn off at least one first light-emitting region of the plurality of first light-emitting regions and turn on at least one second light-emitting region of the plurality of second light-emitting regions positioned under the at least one first light-emitting region in the vertical direction.

19. The headlamp of claim 18, wherein the first driver controller is further configured to, in response to an input signal indicating an object approaching from a front of the headlamp, turn off at least one first light-emitting region of the plurality of first light-emitting regions and turn on remaining first light-emitting regions of the plurality of first light-emitting regions.

20. The headlamp of claim 19, wherein each first light-emitting region of the plurality of first light-emitting regions comprises only one light-emitting cell, wherein each first light-emitting region of the plurality of first light-emitting regions further comprises a partition wall defining the first light-emitting region, and wherein the first driver controller is further configured to simultaneously turns on or off an entirety of each first light-emitting region of the first light-emitting regions.

* * * * *